United States Patent
Lee et al.

(10) Patent No.: US 12,061,756 B2
(45) Date of Patent: Aug. 13, 2024

(54) TOUCH SENSING UNIT AND DISPLAY DEVICE COMPRISING SAME

(71) Applicant: SAMSUNG DISPLAY CO., LTD., Yongin-si (KR)

(72) Inventors: Sun Hwa Lee, Yongin-si (KR); Dong Hoon Lee, Hwaseong-si (KR); Mu Kyung Jeon, Ulsan (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/425,366

(22) PCT Filed: Nov. 21, 2019

(86) PCT No.: PCT/KR2019/016055
§ 371 (c)(1),
(2) Date: Jul. 23, 2021

(87) PCT Pub. No.: WO2020/153593
PCT Pub. Date: Jul. 30, 2020

(65) Prior Publication Data
US 2022/0100303 A1    Mar. 31, 2022

(30) Foreign Application Priority Data

Jan. 24, 2019  (KR) .................. 10-2019-0009501

(51) Int. Cl.
*G06F 3/041*     (2006.01)
*G06F 3/044*     (2006.01)
(Continued)

(52) U.S. Cl.
CPC .......... *G06F 3/0412* (2013.01); *G06F 3/0416* (2013.01); *G06F 3/04164* (2019.05);
(Continued)

(58) Field of Classification Search
CPC .... G06F 3/0412; G06F 3/0446; G06F 3/0443; G06F 3/047; G06F 3/04164;
(Continued)

(56) References Cited

U.S. PATENT DOCUMENTS 10,488,966 B2 * 11/2019 Rhe ................. G06F 3/0446
2009/0085891 A1 * 4/2009 Yang ................ G06F 3/0412
                                                  345/174

(Continued)

FOREIGN PATENT DOCUMENTS

CN    108984011    12/2018
EP    3410270      12/2018

(Continued)

OTHER PUBLICATIONS

International Search Report issued in corresponding application No. PCT/KR2019/016055 on Mar. 4, 2020.

(Continued)

*Primary Examiner* — Dismery Mercedes
(74) *Attorney, Agent, or Firm* — F, CHAU & ASSOCIATES, LLC

(57) ABSTRACT

A touch sensing unit includes first touch electrodes and second touch electrodes disposed on in a touch sensor area which includes a round portion having a curvature. A driving line is connected to a first touch electrode among the first touch electrodes are disposed in the round portion of the touch sensor area. A sensing line is connected to a second touch electrode among the second touch electrodes disposed in the round portion of the touch sensor area. The driving line and the sensing line intersect each other.

20 Claims, 26 Drawing Sheets

(51) Int. Cl.
   *G06F 3/047* (2006.01)
   *H10K 59/131* (2023.01)
   *H10K 59/40* (2023.01)

(52) U.S. Cl.
   CPC .......... *G06F 3/0446* (2019.05); *G06F 3/0448* (2019.05); *G06F 3/047* (2013.01); *H10K 59/131* (2023.02); *H10K 59/40* (2023.02); *G06F 2203/04111* (2013.01)

(58) Field of Classification Search
   CPC ...... G06F 3/0448; G06F 3/0416; G06F 3/041; G06F 3/0445; G06F 2203/04111; G06F 2203/04103; H10K 59/40; H10K 59/131
   See application file for complete search history.

(56) References Cited

U.S. PATENT DOCUMENTS

| | | | | |
|---|---|---|---|---|
| 2011/0048813 | A1* | 3/2011 | Yilmaz | G06F 3/0443 178/18.06 |
| 2016/0048246 | A1* | 2/2016 | Park | G06F 3/04166 345/173 |
| 2016/0239131 | A1* | 8/2016 | Kang | G06F 3/0443 |
| 2016/0351098 | A1* | 12/2016 | Lin | G09G 3/20 |
| 2017/0123572 | A1* | 5/2017 | Song | G06F 3/0446 |
| 2017/0185224 | A1* | 6/2017 | Nagata | G06F 3/0448 |
| 2018/0061897 | A1* | 3/2018 | Oh | G06F 3/0443 |
| 2018/0120988 | A1* | 5/2018 | Kim | G06F 3/0418 |
| 2018/0348906 | A1* | 12/2018 | Hwang | G06F 3/0445 |
| 2018/0348929 | A1* | 12/2018 | Rhe | G06F 3/0446 |
| 2018/0356668 | A1* | 12/2018 | Koide | G06F 3/0445 |
| 2019/0019855 | A1 | 1/2019 | Park et al. | |
| 2019/0129548 | A1* | 5/2019 | Hwang | G06F 3/04164 |
| 2019/0204974 | A1* | 7/2019 | Gong | G06F 3/0443 |
| 2020/0050311 | A1 | 2/2020 | Rhe et al. | |
| 2020/0089351 | A1* | 3/2020 | Jeong | G06F 3/0448 |
| 2020/0167037 | A1* | 5/2020 | Lee | H10K 59/873 |

FOREIGN PATENT DOCUMENTS

| | | |
|---|---|---|
| KR | 10-2017-0051611 | 5/2017 |
| KR | 10-2018-0131764 | 12/2018 |

OTHER PUBLICATIONS

Extended European Search Report issued in corresponding EP 19911739.1 on Jan. 10, 2023.
Chinese Office Action dated Sep. 22, 2023 issued in corresponding Chinese Patent Application No. 201980090150.7.
Korean Office Action dated Nov. 20, 2023 issued in corresponding Korean Patent Application No. 10-2019-0009501.

* cited by examiner

TOUCH SENSING UNIT AND DISPLAY DEVICE COMPRISING SAME

CROSS-REFERENCE TO RELATED APPLICATIONS

This application is a national stage entry of International Application Number PCT/KR2019/016055, filed on Nov. 21, 2019, which claims priority to Korean Patent Application No. 10-2019-0009501, filed on Jan. 24, 2019 in the Korean Intellectual Property Office, the disclosures of which are incorporated by reference herein in their entireties.

TECHNICAL FIELD

The present disclosure relates to a touch sensing unit and a display device including the same.

DISCUSSION OF RELATED ART

Electronic devices, such as smartphones, tablet personal computers (PCs), cameras, laptop computers, navigation devices, and televisions (TVs), which provide images to a user, include a display device for displaying an image. The display device includes a display panel configured to generate and display an image and various input devices.

Many touch sensing units which detect a touch input are being applied as input devices of display devices, specifically, mainly to smartphones or tablet PCs. The touch sensing unit determines whether a touch of a user is input and calculates touch input coordinates of a corresponding position.

Meanwhile, recently, display panels of smart phones have been designed to include round portions formed with a predetermined curvature. In this case, a touch sensing unit should have a predetermined curvature so as to detect a touch input at the round portion.

SUMMARY

Aspects of the present disclosure provide a touch sensing, unit capable of detecting a touch input in a round, portion formed with a predetermined curvature.

Aspects of the present disclosure provide a display device capable of detecting a touch input in a round portion formed with a predetermined curvature.

It should be noted that objects of the present disclosure are not limited to the above-described objects, and other objects of the present disclosure will be apparent to those skilled in the art from the following descriptions.

According to one exemplary embodiment of the present disclosure, a touch sensing unit includes first touch electrodes and second touch electrodes disposed in a touch sensor area which includes a round portion having a curvature. A driving line is connected to a first touch electrode among the first touch electrodes disposed in the round portion of the touch sensor area. A sensing line is connected to a second touch electrode among the second touch electrodes disposed in the round portion of the touch sensor area. The driving line and the sensing line intersect each other.

A planar shape of the first touch electrode connected to the driving line in the round portion is different from a planar shape of first touch electrodes that are disposed in areas excluding the round portion.

A planar shape of the second touch electrode connected to the sensing line in the round portion is different from a planar Shape of second touch electrodes that are disposed in areas excluding the round portion.

Each of the driving line and the sensing line includes a plurality of touch signal layers, and each of the driving line and the sensing line includes one touch signal layer among the plurality of touch signal layers in an intersection area between the driving line and the sensing line. The one touch signal layer of each of the driving line and the sensing line in the intersection area are different from each other.

Each of the driving line and the sensing line may include a first touch signal layer and a second touch signal layer, and the first touch signal layer of the driving line may intersect the second touch signal layer of the sensing line.

The second touch signal layer may be disposed on the first touch signal layer.

The first touch electrodes and the second touch electrodes may be disposed on a same layer with the second touch signal layer.

The touch sensing unit may further include connection electrodes that connects the first touch electrodes and intersects the second touch electrodes. The connection electrode is disposed on a same layer with the first touch signal layer.

According to another exemplary embodiment of the present disclosure, a touch sensing unit includes first touch electrodes and second touch electrodes disposed in a touch sensor area, driving lines connected to the first touch electrodes, sensing lines of a first group electrically connected to a first portion of the second touch electrodes, and sensing lines of a second group electrically connected to a remaining portion of the second touch electrodes not including the first portion. At least one of the sensing lines of the first group intersects at least one of the driving lines.

The touch sensor area may include a round portion having a curvature. At least one of the sensing lines of the first group may be connected to a second touch electrode of the second touch electrodes that is disposed in the round portion.

At least one of the driving lines may be connected to a first touch electrode of the first touch electrodes that is disposed in the round portion.

The sensing lines of the first group may be disposed at a first side of the touch sensor area, and the sensing lines of the second group may be disposed at a second side of the touch sensor area.

The number of the sensing lines of the first group may be less than the number of the sensing lines of the second group.

The touch sensing unit may further include first touch pads connected to the sensing lines of the first group and second touch pads connected to the sensing lines of the second group.

The first touch pads may be disposed at a first side of a pad area, and the second touch pads may be disposed at a second side of the pad area.

The touch sensing unit may further include a guard line surrounding: a sensing line disposed at an outermost side among the, sensing lines of the first group and a sensing line disposed at an outermost side among the sensing lines of the second group.

According to still another exemplary embodiment of the present disclosure, a touch sensing unit includes first touch electrodes and second touch electrodes disposed an a touch sensor area that includes a plurality of round portions. Driving lines of a first group are electrically connected to a first portion of the first touch electrodes. Driving lines of a second group are electrically connected to a remaining, portion of the first touch electrodes not including the first portion of the first touch electrodes. Sensing lines of a first group electrically connected to a first portion of the second touch electrodes, and sensing lines of a second group electrically connected to a remaining portion of the second touch electrodes not including the first portion of the second touch electrodes. Some of the sensing lines of the first group are connected to the second touch electrodes disposed in a first round portion of the plurality of round portions, and the driving lines of the first group are connected to the first touch electrodes disposed in a second round portion of the plurality of round portions.

The sensing lines of the first group may be disposed between the driving lines of the first group and the driving lines of the second group.

The touch sensing unit may further include a guard line disposed. between the sensing lines of the first group and the driving lines of the first group.

The sensing lines of the first group may be disposed at a first side of the touch sensor area, and the sensing lines of the second group may be disposed at a second side of the touch sensor area.

The driving lines of the first group may be disposed at the first side of the touch sensor area.

The driving lines of the second group may be disposed at a third side of the touch sensor area.

The number of the sensing lines of the first group may be less than the number of the sensing lines of the second group.

The number of the driving lines of the firs group may be less than the number of the driving lines of the second group.

According to yet another exemplary embodiment of the present disclosure, a touch sensing unit includes first touch electrodes and second touch electrodes disposed in a touch sensor area which includes a round poi having a curvature. Driving lines are connected to a first portion of the first touch electrodes disposed in the round portion of the touch sensor area among the first touch electrodes. Sensing lines are connected to a first portion of the second touch electrodes disposed in the round portion of the touch sensor area among the second touch electrodes. The driving lines and the sensing lines are alternately disposed in the round portion of the touch sensor area.

Each of the driving lines and the sensing lines may include a first touch signal layer and a second touch signal layer, and the first touch electrodes and the second touch electrodes may be disposed on a same layer with the second touch signal layer.

The touch sensing unit may further it elude a connection electrode connecting the first touch electrodes. The connection electrode is disposed on a same layer with the first touch signal layer.

According to one exemplary embodiment of the present disclosure, a display device includes a display unit including a display area which includes pixels. A touch sensor area overlaps the display area and includes a touch sensing unit. The touch sensing unit includes first touch electrodes and second touch electrodes disposed in a round portion of the touch sensor urea having a curvature. Driving lines are connected to a first portion of the first touch electrodes disposed in the round portion of the touch sensor area among the first touch electrodes. Sensing lines are connected to a first portion of the second touch electrodes disposed in the round portion of the touch sensor area among the second touch electrodes. At least one driving line of the driving lines and at least one sensing line of the sensing lines intersect each other.

According to a touch sensing unit and a display device including the same according to one exemplary embodiment, in an intersection area between a driving line and a sensing line, the driving line can include one of a first touch signal. layer and a second touch signal layer, and the sensing line can include the other of the first touch signal layer and the second touch signal layer. Accordingly, a short circuit between the driving line and the sensing line connected to touch sensors disposed in a round portion can be prevented so that the touch sensors can be disposed to detect a touch input in the round portion formed with a predetermined curvature.

In addition, according; to a touch sensing unit and a display device including the same according to one exemplary embodiment, since driving lines and sensing lines are designed so as to not intersect each other in a round portion, a short circuit between the driving lines and the sensing lines connected to touch sensors disposed in the round portion can be prevented so that the touch sensors can be disposed to detect a touch input in the round portion formed with a predetermined curvature.

Furthermore, according to a touch sensing Unit and a display device including the same according to one exemplary embodiment, since driving lines and sensing lines include a plurality of touch signal layers, resistance can be lowered. Therefore, a speed at which mutual capacitance is charged by a driving signal may be increased without lowering a frequency of the driving signal, thereby increasing touch sensitivity.

Effects of the present disclosure are not limited to the exemplary embodiments set forth herein and more diverse effects are included in the present specification.

BRIEF DESCRIPTION OF THE DRAWINGS

FIG. 25 is a cross-sectional view of an embodiment which is taken along line VI-VI' of FIG. 27.

DETAILED DESCRIPTION OF EMBODIMENTS

Figure 1:
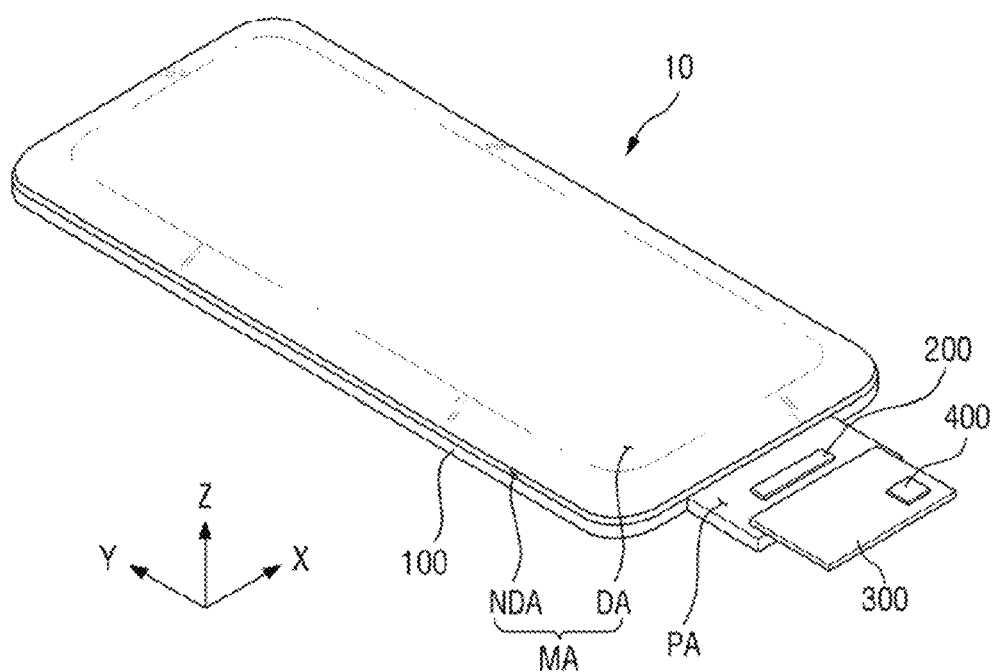
FIG. 1 is a perspective view illustrating a display device according to one exemplary embodiment.

The advantages and features of the present disclosure and methods for accomplishing the same will be more clearly understood from exemplary embodiments to be described in detail below with reference to the accompanying drawings. However, the present disclosure is not limited to the following exemplary embodiments but may be implemented in various different forms. The exemplary embodiments are provided only to complete the present disclosure and to fully provide the scope of the present disclosure to a person having ordinary skill in the art to which the present disclosure pertains, and the present disclosure will be defined by the appended claims.

It will be understood that when an element or a layer is referred to as being "on" or "above" another element or layer, it can be directly on or above another element or layer or intervening elements or layers may be present. Like reference numerals generally denote like elements throughout the present specification. A shape, a size, a ratio, an angle, and a number disclosed in the drawings for describing exemplary embodiments of the present disclosure are merely an example, and thus, the present disclosure is not limited to the illustrated details.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the present disclosure.

Features of various exemplary embodiments of the present disclosure may be combined partially or totally. Technically various interactions and operations are possible. The various exemplary embodiments can be practiced individually or in combination.

Hereinafter, specific exemplary embodiments will be described with reference to the accompanying drawings.

Figure 2:
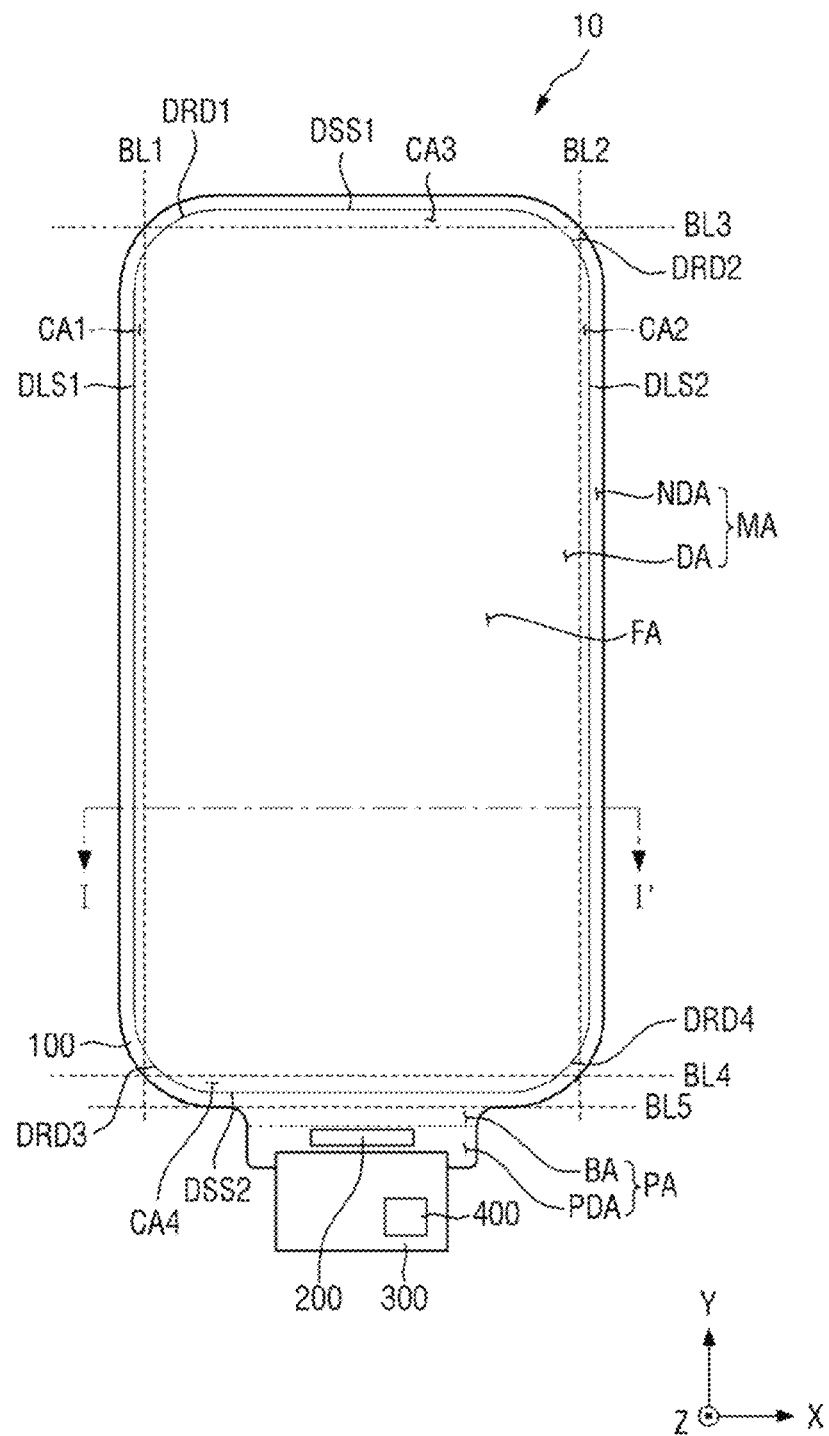
FIG. 2 is a plan view illustrating a display panel, a display driving circuit, a display circuit board, and a touch driving circuit according to one exemplary embodiment.

FIG. 1 is a perspective view illustrating a display device according to one exemplary embodiment. FIG. 2 is a plan view illustrating a display panel, a display driving circuit, a display circuit board, and a touch driving circuit according to one exemplary embodiment.

In the present specification, the terms "above," "upper portion," "top," and "upper surface" refer to an upward direction, that is, a Z-axis direction., based on a display panel 100, and the terms "'below," "lower portion," "bottom.," and "lower surface" refer to a downward direction, that is, a direction opposite to the Z-axis direction, based on the display panel 100. In addition, the terms "left," "right," "upper," and "lower" refer to directions when the display panel 100 is viewed in a plan view. For example, the term "right" refers to an X-axis direction, the term "left" refers to a direction opposite to the X-axis direction., the term "upper" refers to a Y-axis direction, and the term "lower" refers to a direction opposite to the Y-axis direction.

Referring to FIGS. 1 and 2, a display device 10 is a device which displays a video or a still image. The display device ltd may be used in portable electronic devices such as a mobile phone, a smartphone, a tablet personal computer (PC), a smart watch, a watch phone, a mobile communication terminal, an electronic notebook, an electronic book reader, a portable multimedia player (PMP), a navigation device, and an ultra-mobile PC (UMPC) and may also be used as a display screen of various products such as a television, a laptop computer, a monitor, a billboard, and a device for the Internet of Things (IOT). The display device 10 may be any one of an organic light-emitting display device, a liquid crystal display device, a plasma display device, a field emission display device, an electrophoretic display device, an electro-wetting display device, a quantum dot light-emitting display device, and a micro light-emitting diode (LED) display device. Hereinafter, it will be mainly described that the display device 10 is the organic light-emitting display device, but the present disclosure is not limited thereto.

The display device 10 according to one exemplary embodiment includes the display panel 100, a display driving circuit 200, a circuit board 300, and a touch driving circuit 400.

The display panel 100 may include a flexible substrate that is bendable, foldable, or rollable. For example, the flexible substrate may include polyethersulphone (PES), polyacrylate (PA), polyarylate (PAR), polyetherimide (PET), polyethylene naphthalate (PEN), polyethylene terephthalate (PET). polyphenylene sulfide (PPS), polyarylate, polyimide (PI), polycarbonate (PC), cellulose triaceta e (CAT), cellulose acetate propionate (CAP), or a combination thereof.

The display panel 1.00 may include a main area MA and a protrusion area PA protruding from one side of the main area MA.

The main area MA may be formed as a rectangular plane which has short sides in a first direction (X-axis direction) and long sides in a second direction (Y-axis direction) intersecting the first direction (X-axis direction). A corner at which the short side in the first direction (X-axis direction) meets the long side in the second direction (Y-axis direction) may be rounded to have a predetermined curvature. In FIGS. 1 and 2, although a planar shape of the display device 10 is illustrated as being formed as a quadrangular shape having an edge or corner that is rounded, the present disclosure is not limited thereto, and the planar shape of the display device 10 may be formed as another polygonal shape, circular shape, or elliptical shape.

The main area MA may include a display area DA in which pixels are formed to display an image and a non-display area NDA which is a peripheral area of the display area DA. The non-display area NDA may be defined as an area from an edge of the display area DA to an edge of the display panel 100.

As shown in FIG. 2, the display area DA may include a first display round portion DRD1, a second display round portion DRD2, a third display round portion DRD3, and a fourth display round portion DRD4. The first display round portion DRD1 corresponds to an edge or a corner between a first display short side DSS1 and a first display long side DLS1. The second display round portion DRD2 corresponds to an edge or a corner between the first display short side DSS1 and a second display long side DLS2. The third display round portion DRD3 corresponds to an edge or a corner between a second display short side DSS2 and the first display long side DLS1. The fourth display round portion DRD4 corresponds to an edge or a corner between the second display short side DSS2 and the second display long side DLS2. The first display round portion DRD1, the second display round portion DRD2, the third display round portion DRD3, and the fourth display round portion DRD4 may have substantially the same curvature or different curvatures. Alternatively, at least two of the first display round portion DRD1, the second display round portion DRD2, the third display round portion DRD3, and the fourth display round portion DRD4 may have substantially the same curvature. In addition, each of the first display round portion DRD1, the second display round portion DRD2, the third display round portion DRD3, and the fourth display round portion DRD4 may have a substantially constant curvature or variable curvature.

Not only the pixels but also scan lines, data lines, and power lines. connected to the pixels may be disposed in the display area DA. A scan driver configured to apply scan signals to the scan lines and link Ines configured to connect the data lines and the display driving circuit 200 may be disposed in the non-display area NDA.

In addition, as shown in FIG. 2, the main area. MA may include a flat portion FA formed to be flat, a first curved portion CA1 extending from a left side of the flat portion FA, a second curved portion CA2 extending from a right side of the flat portion FA, a third curved portion CA3 extending from an upper side of the flat portion FA, and a Rattail curved portion CA4 extending from a lower side of the flat portion FA. The first curved portion. CA1 refers to an area bent at a first curvature along a first bending line BL1. The second curved portion CA2 refers to an area bent at a second curvature along a second bending line BL2. The third curved portion CA3 refers to an area bent at a third curvature along a third bending line BL3, The fourth curved portion. CA4 refers to an area bent at a fourth curvature along a fourth betiding line BL4. The first to fourth curvatures may be substantially the same or different. In addition, each of the first to fourth curvatures may be a constant curvature or may be a variable curvature.

At least one of the first to fourth curved portions CA1, CA2, CA3, and CA4 may be disposed in the display area DA. In FIGS. 1 and 2, all of the first to fourth curved portions CA1, CA2, CA3, and CA4 are illustrated as being disposed in the display area DA, and in this case, an image of the display panel 100 may also be visible in the first to fourth curved portions CA1, CA2, CA3, and CA4.

The protrusion area PA may protrude from one side of the main area MA. For example, as shown in FIG. 2, the protrusion area PA may protrude from a lower side of the main area MA. A length of the protrusion area PA in the first direction (X-axis direction) may be less than a length of the main area MA in the first direction (X-axis direction).

The protrusion area PA may include a bending area BA and a pad area. PDA. In this case, the pad area PDA may be disposed at one side of the bending area BA, and the main area MA may be disposed at the other side of the bending area BA. For example, the pad area PDA may be disposed at a lower side of the bending area BA, and the main area MA may be disposed at an upper side of the bending area BA.

The bending area BA refers to an area bent at a fifth curvature along a fifth bending line BL5. Before the display panel 100 is bent, a first surface of the pad area PDA of the display panel 100 faces upward, and after the display panel 100 is bent, the first surface of the pad area PDA of the display panel 100 faces downward. Accordingly, the pad area PDA may be disposed on a lower portion of the main area MA and thus may overlap the main area MA.

Figure 3:
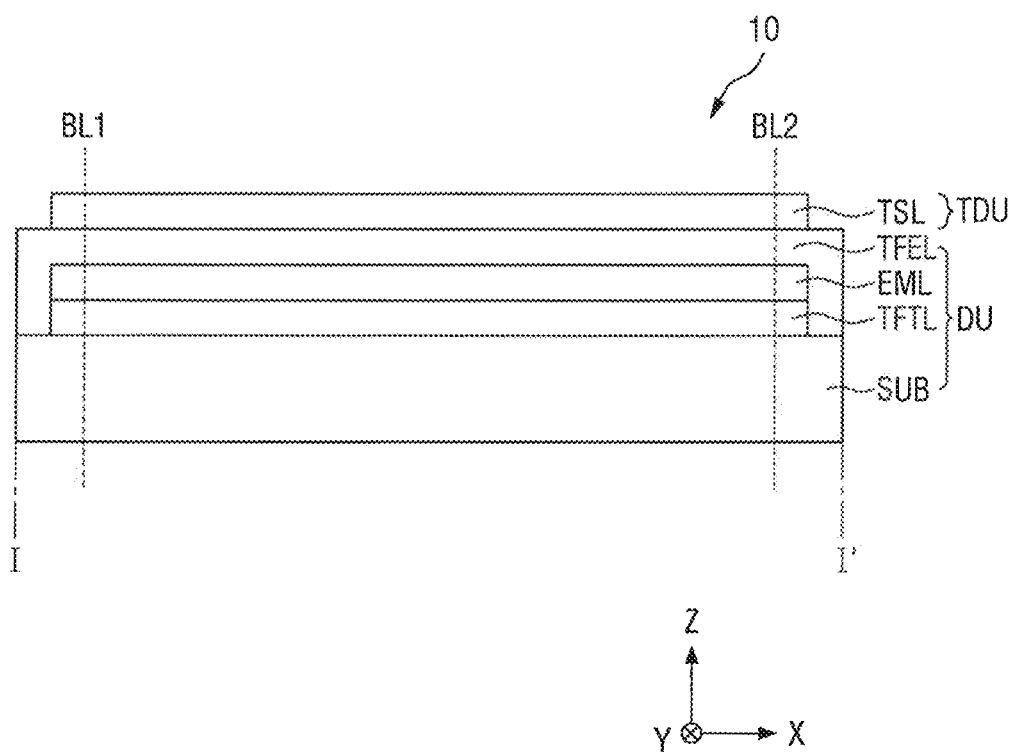
FIG. 3 is a cross-sectional view of an embodiment which is taken along line I-I' of FIG. 2.

As shown in FIG. 3, in the main area MA, the display panel 100 may include a display unit DU including a thin film transistor layer TFTL, a light-emitting element layer EML, and a thin film encapsulation layer TFEL and a touch sensing unit TDU including a touch sensor layer TSL. In FIG. 3, the touch sensing unit TDU including the touch sensor layer TSL is illustrated as being included in the display panel 100. However, the present disclosure is not limited thereto. For example, the touch sensing unit TDU may be formed as a separate touch panel, and in this case, the separate touch panel may be attached onto the display panel 100.

Pads electrically connected to the display driving circuit 200 and the circuit board 300 may be disposed in the pad area PDA of the display panel 100.

The display driving circuit 200 outputs signals and voltages for driving the display panel 100. For example, the display driving circuit 200 may supply data voltages to the data lines. In addition, the display driving circuit 200 may supply a power voltage to the power line and may supply scan control signals to the scan driver. The display driving circuit 200 may be formed as an integrated circuit (IC) and may be mounted on the display panel 100 in the pad area PDA through a chip-on-glass (COG) method, a chip-on-plastic (COP) method, or an ultrasonic bonding method. However, the present disclosure is not limited thereto. For example, the display driving circuit 200 may be mounted on the circuit board 300.

The pads may include display pads electrically connected to the display driving circuit 200 and touch pads electrically connected to touch lines.

The circuit board 300 may be attached onto the pads using an anisotropic conductive film. As a result, lead lines of the circuit board 300 may be electrically connected to the pads. The circuit board 300 may be a flexible film such as a flexible printed circuit board, a printed circuit board, or a chip-on film.

The touch driving circuit 400 (FIG. 1) may be connected to touch electrodes of the touch sensor layer TSL of the display panel 100. The touch driving circuit 400 applies driving signals to the touch electrodes of the touch sensor layer TSL and measures capacitance values of the touch electrodes. The driving signal may be a signal having a plurality of driving pulses. The touch driving circuit 400 may determine whether a touch is input based on the capacitance values and may also calculate touch coordinates at which the touch is input.

The touch driving circuit 400 may be disposed on the circuit board 300. The touch driving circuit 400 may be formed as an IC and mounted on the circuit board 300.

FIG. 3 is a cross-sectional view of an embodiment which is taken along line I-I' of FIG.

Referring to FIG. 3, the display panel 100 may include a substrate SUB, the display unit DU including the thin film transistor layer TFTL, the light-emitting element layer EML and the thin film encapsulation layer TFEL which are disposed on the substrate SUB, and the touch sensing unit TDU including the touch sensor layer TSL The substrate SUB may be a flexible substrate that is bendable, foldable, or rollable For example, the flexible substrate may include PES, PA, PAR, PEI, PEN, PET, PPS, polyallylate, PI, PC, CAT, CAP, or a combination thereof.

Figure 4:
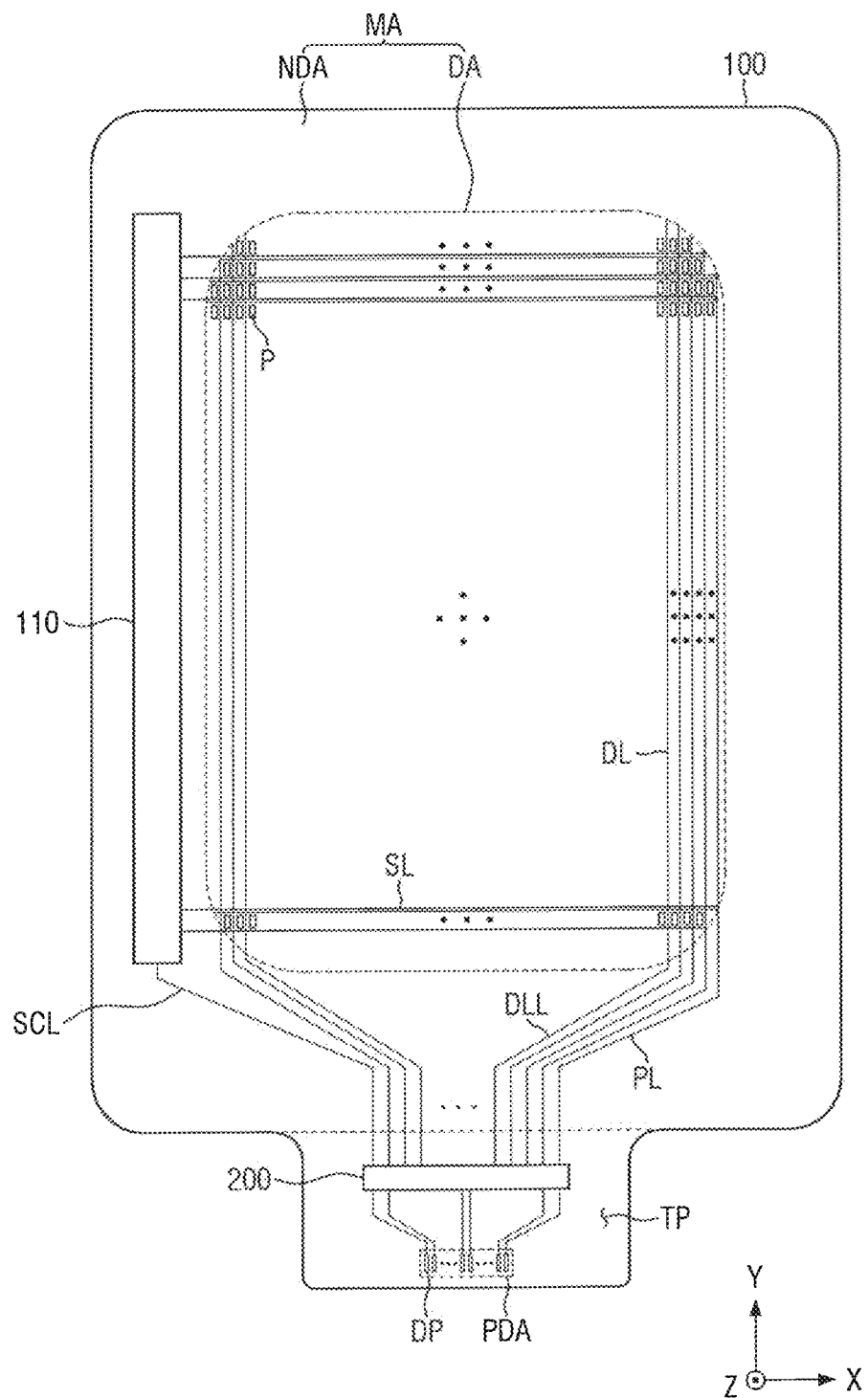
FIG. 4 is a plan view illustrating an embodiment of a display unit of FIG. 3 in detail.

The thin film transistor layer TFTL may be disposed on the substrate SUB. Not only thin film transistors of each of the pixels but also scan lines, data lines, power lines, scan control lines, and link lines connecting the pads and the data. lines are formed in the thin film transistor layer TFTL. Each of the thin film transistors may include a gate electrode, a semiconductor layer, a source electrode, and a drain electrode. When a scan driver 110 is formed in the non-display area NDA of the display panel 100 as shown in FIG. 4, the scan driver 110 may include thin film transistors.

The thin film transistor layer TFTL may be disposed in the display area DA and the non-display area NDA. Specifically, the thin film transistors of each of the pixels, the scan lines, the data lines, and the power lines of the thin film transistor. layer TFTL may be disposed in the display area DA. The scan control lines and the link lines of the thin film transistor layer TFTL may be disposed in the non-display area NDA.

The light-emitting element layer EML may be disposed on the thin film transistor layer TFTL. The light-emitting element layer EML may include the pixels which each include a first electrode, a light-emitting layer, and a second electrode, and a pixel definition film which defines the pixels. The light-emitting layer may include an organic light-emitting layer including an organic material. In this case, the light-emitting layer may include a hole transport layer, an organic light-emitting layer, and an electron transport layer. When a certain voltage is applied to the first electrode through the thin film transistor of the thin film transistor layer TFTL and a cathode voltage is applied to the second electrode, holes and electrons are moved to the organic light-emitting layer through the hole transport layer and the electron transport layer and are combined with each other in the organic light-emitting layer to emit light. The pixels of the light-emitting element layer EML may be disposed in the display area DA.

The thin film encapsulation layer TFEL may be disposed on the light-emitting element layer EML. The thin film encapsulation layer TFEL serves to prevent oxygen or moisture from permeating into the light-emitting element layer EML. To this end, the thin film encapsulation layer TFEL may include at least one inorganic film. The inorganic film may include a silicon nitride layer, a silicon oxynitride layer, a silicon oxide layer, a titanium oxide layer, or an aluminum oxide layer. However, the present disclosure is not limited thereto. In addition, the thin film encapsulation layer TFEL serves to protect the light-emitting element layer. EML from foreign materials such as dust. To this end, the thin film encapsulation layer TFEL may include at least one organic film. The organic film may be made of acryl resin, epoxy resin, phenolic resin, polyamide resin, PI resin, or the like. However, the present disclosure is not limited thereto.

The thin film encapsulation layer TFEL may be disposed in both of the display area DA and the non-display area NDA. Specifically, the thin film encapsulation layer TFEL may be disposed to cover the light-emitting element layer EML of the display area DA and the non-display area NDA and cover the thin film transistor layer TFTL of the non-display area NDA.

The touch sensor layer TSL may be disposed on the thin film encapsulation layer TFEL. Since the touch sensor layer TSL is disposed directly on the thin film encapsulation layer TFEL, a thickness of the display device 10 may be decreased as compared with a case in which a separate touch panel including the touch sensor layer TSL is attached onto the thin film encapsulation layer TFEL.

The touch sensor layer TSL may include the touch electrodes for sensing a touch of a user using a mutual capacitance method and the touch lines for connecting the pads and the touch electrodes. For example, the touch sensor layer TSL may detect a touch of a user using a self-capacitance method or a mutual capacitance method.

The touch electrodes of the touch sensor layer TSL may be disposed in the display area DA. The touch lines of the touch sensor layer TS may be disposed in the non-display area NDA.

A cover window may be additionally disposed on the touch sensor layer TSL, and in this case, the touch sensor layer TSL and the cover window may be attached through a transparent adhesive member.

FIG. 4 is a plan view illustrating an embodiment of the display unit of FIG. 3 in detail. For convenience of description, only pixels P, scan lines SL, data lines DL, a power line PL, scan control lines SCL, the scan driver 110, the display driving circuit 200, and display pads DP of the display unit DU are illustrated in FIG. 4.

Referring to FIG. 4, the scan lines SL, the data lines DL, the power line PL, and the pixels P are disposed in the display area DA. The scan lines SE may be formed in parallel in the first direction (X-axis direction), and the data lines DL may be formed in parallel in the second direction (Y-axis direction) intersecting the first direction (X-axis direction). The power line PL may include at least one line formed parallel to the data lines DL in the second direction DR2 and a plurality of lines branched off from the at least one line in the first direction DR1.

Each of the pixels P may be connected to at least one of the scan lines SL, one of the data lines DL, and the power line PL. Each of the pixels P may include thin film transistors including a driving transistor and at least one switching transistor, an organic light-emitting diode, and a capacitor. When a scan signal is applied from the scan line SL, each of the pixels P may receive a data voltage of the data line DL and may supply a driving current to the organic light-emitting diode in response to the received data voltage to emit light.

The scan driver 110 is connected to the display driving circuit 200 through at least one scan control line SCL. Therefore, the scan driver 110 may receive a scan control signal of the display driving circuit 200. The scan driver 110 generates scan signals in response to the scan control signal and supplies the scan signals to the scan lines SL.

In FIG. 4, the scan driver 110 is illustrated as being formed in the non-display area NDA at a left side of the display area DA. However, the present disclosure is not limited thereto. For example, the scan driver 110 may be formed in the non-display areas NDA at left and right sides of the display area DA.

The display driving circuit 200 is connected to the display pads DP and receives digital video data and timing signals. The display driving circuit 200 converts the digital video data into analog positive/negative data voltages and supplies the analog positive/negative data voltages to the data lines DL through fink lines DLL Furthermore, the display driving circuit 200 generates and supplies a scan control signal for controlling the scan driver 110 through the scan control line SCL. The pixels P to which data voltages are supplied are selected by scan signals of the scan driver 110, and the data voltages are supplied to the selected pixels P. The display driving circuit 200 may be formed as an IC and may be attached onto the substrate SUB through a COG method, a COP method, or an ultrasonic bonding method.

Figure 5:
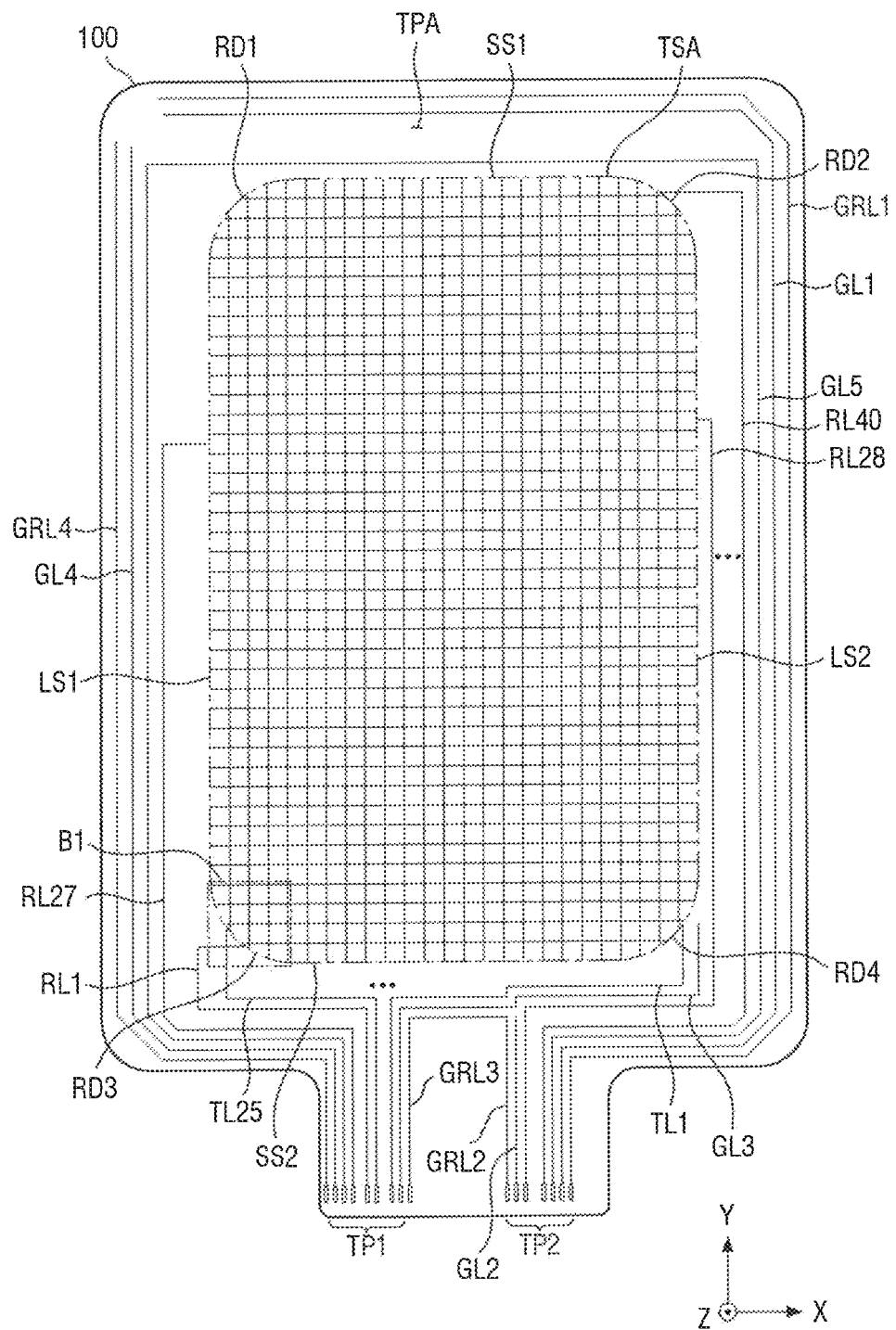
FIG. 5 is a plan view illustrating an embodiment of a touch sensing unit of FIG. 3 in detail.

FIG. 5 is a plan view illustrating an embodiment of the touch sensing unit of FIG. 3 in detail. For convenience of description, only touch sensors TS, first touch lines TL1 to TL25, second touch lines RL1 to RL40, first touch pads TP1, and second touch pads TP2 are illustrated in FIG. 5. Hereinafter, for convenience of description, the first touch lines will be described as driving lines TL1 to TL25, and the second touch lines will be described as sensing lines RL1 to RL40.

Referring to FIG. 5, the touch sensing unit TDU includes a touch sensor area TSA for sensing a touch of a user and a touch peripheral area TPA disposed at a periphery of the touch sensor area TSA.

The touch sensor area TSA may include a first round portion RD1, a second round portion RD2, a third round portion RD3, and a fourth round portion RD4. The first round portion RD1 corresponds to an edge or a corner between a first short side SS1 and a first long side LS1. The second round portion RD2 corresponds to an edge or a corner between the first short side SS1 and a second long side LS2. The third round portion RD3 corresponds to an edge or a corner between a second short side SS2 and the first long side LS1. The fourth round portion RD4 corresponds to an edge or a corner between the second short side SS2 and the second long side LS2. The first round portion RD1, the second round portion RD2, the third round portion RD3, and the fourth round portion RD4 may have substantially the same curvature or different curvatures. Alternatively, at least two of the first round portion RD1, the second round portion RD2, the third round portion RD3, and the fourth round portion RD4 may have substantially the same curvature. In addition, each of the first round portion RD1, the second round portion. RD2, the third round portion RD3, and the fourth round portion RD4 may have a substantially constant curvature or variable curvature.

The touch sensor area TSA may overlap the display area DA of the display unit DU, and the touch peripheral area TPA may overlap the non-display area NDA of the display unit DU. In this case, the first round portion RD1 and the first display round portion DRD1 may overlie each other and may have substantially the same curvature. The second round portion RD2 and the second display round portion DRD2 may overlap each other and may have substantially the same curvature. The third round portion RD3 and the third display round portion DRD3 may overlap each other and may have substantially the same curvature. The fourth round portion RD4 and the fourth display round portion DRD4 may overlap each other and may have substantially the same curvature. The first short side SS1 and the first display short side DSS1 may overlap each other and may have substantially the same length. The second short side SS2 and the second display short side DSS2 may overlap each other and may have substantially the same length. The first long side LS1 and the first display long side DLS1 may overlap each other and may have substantially the same length. The second long side LS2 and the second display long side DLS2 may overlap each other and may have substantially the same length.

The touch sensors TS may be disposed in the touch sensor area TSA, Although FIG. 5 illustrates that 25 touch sensors TS are disposed in the first direction (X-axis direction) and 40 touch sensors TS are disposed in the second direction (Y-axis direction) in the touch sensor area TSA, the number of the touch sensors TS disposed in the touch sensor area TSA is not limited thereto. As shown in FIG. 5, the touch sensors TS may be disposed in 40 rows and 25 columns.

As shown in FIG. 5, the touch sensors TS may be defined as having a quadrangular shape. However, due to a curvature of each of the first round portion RD1, the second round portion RD2, the third round portion RD3, and the fourth round portion RD4, the touch sensors TS disposed in the first round portion RD1, the second round portion RD2, the third round portion RD3, or the fourth round portion RD4 cannot have a quadrangular shape. That is, a planar shape of the touch sensors TS disposed in the first round portion RD1, the second round portion RD2, the third round portion RD3, or the fourth round portion RD4 may be different from a planar shape of the touch sensors TS disposed in areas excluding the first round portion RD1, the second round portion RD2, the third round portion RD3, and the fourth round portion RD4. Therefore, an area of the touch sensors TS disposed in the first round portion RD1, the second round portion RD2, the third round portion RD3, or the fourth round portion RD4 may be different from an area of the touch sensors TS disposed in the areas excluding the first round portion RD1, the second round portion RD2, the third round portion RD3, and the fourth round portion RD4. In addition, the areas of the touch sensors TS may be different according to arrangement positions in the first round portion RD1, the second round portion RD2, the third round portion RD3, or the fourth round portion RD4.

The touch sensors TS may include second touch electrodes RE electrically connected in the first direction (X-axis direction) and first touch electrodes IF electrically connected in the second direction (Y-axis direction) intersecting the first direction (X-axis direction). In order to prevent a short circuit between the first touch electrodes TE and the second touch electrodes RE in intersection areas thereof, the first touch electrodes TE may be connected through connection electrodes BE. Each of the touch sensors TS will be described in detail below reference to FIGS. 6 to 8.

Driving lines TL and sensing lines RE may be disposed in the touch peripheral area TPA. The driving lines TL may be electrically connected to the first touch electrodes TE of the touch sensors TS, and the sensing lines RE may be electrically connected to the second touch electrodes RE of the touch sensors TS. Specifically, the first touch electrodes TE of the touch sensors TS are electrically connected in the second direction (Y-axis direction). Accordingly, the driving lines TL1 to TL25 are connected to the first touch electrodes TE of the touch sensors TS disposed at one side end among the touch sensors TS electrically connected in the second direction (Y-axis direction).

For example, as shown in FIG. 5, first to $25^{th}$ driving lines TL1 to TL25 may be respectively connected to the first touch electrodes TE of the touch sensors TS, which are disposed at a lower side end of the touch sensor area TSA, in first to $25^{th}$ columns. The first driving line TL1 may be connected to the first touch electrodes TE of the touch sensors TS in the first column disposed at a rightmost side of the touch sensor area TSA. The $25^{th}$ driving line TL25 may be connected to the first touch electrodes IF of the touch sensors TS in the $25^{th}$ column disposed at a leftmost side of the touch sensor area TSA. In FIG. 5, the first column is illustrated as being disposed at the rightmost side of the touch sensor area TSA, the $25^{th}$ column is illustrated as being disposed at the rightmost side of the touch sensor area TSA, and the second to $24^{th}$ columns are illustrated as being sequentially between the first column and the $25^{th}$ column.

In addition, the second touch electrodes RE of the touch sensors TS are electrically connected in the first direction (X-axis direction) Accordingly, the sensing lines RL1 to RL40 are connected to the second touch electrodes RE of the touch sensors TS disposed at one side end or the other side end among the much sensors TS electrically connected in the first direction (X-axis direction).

For example, as shown in FIG. 5, first to $27^{th}$ sensing lines RL1 to RL27 may be disposed at a left side of the touch sensor area TSA. The first to $27^{th}$ sensing lines RL1 to RL27 may be respectively connected to the second touch electrodes RE of the touch sensors TS, which are disposed at the left side of the touch sensor area TSA, in first to $27^{th}$ rows. The first sensing line RL1 may be connected to the second touch electrodes RE of the touch sensors TS in the first row disposed at a lowermost side of the touch sensor area TSA. The $27^{th}$ sensing line RL27 may be connected to the second touch electrodes RE of the touch sensors TS in the $27^{th}$ row of the touch sensor area TSA. In FIG. 5, the first row is illustrated as being disposed at the lowermost side of the touch sensor area TSA, and the second to $27^{th}$ rows are illustrated as being sequentially disposed from the first row in an upward direction (Y-axis direction).

In addition, $28^{th}$ to $40^{th}$ sensing lines RL28 to RL40 may be disposed at a right side of the touch sensor area TSA. The $28^{th}$ to $40^{th}$ sensing lines RL28 to RL40 may be respectively connected to the second touch electrodes RE of the touch sensors TS, which are disposed at the right side of the touch sensor area TSA, in $28^{th}$ to $40^{th}$ rows. The $28^{th}$ sensing line RL28 may be connected to the second touch electrodes RE of the touch sensors TS in the $28^{th}$ row of the touch sensor area TSA. The $40^{th}$ sensing line RL40 may be connected to the second touch electrodes RE of the touch sensors TS in the $40^{th}$ row of the touch sensor area TSA. In FIG. 5, the $28^{th}$ to $40^{th}$ rows are illustrated as being sequentially disposed from the $27^{th}$ row in the upward direction (Y-axis direction).

Meanwhile, in the present specification, for convenience of description, the first to $27^{th}$ sensing lines RL1 to RL27 may be defined as sensing lines of a first group or second touch lines of a first group, and the $28^{th}$ to $40^{th}$ sensing lines RL28 to RL40 may be defined as sensing lines of a second group or second touch lines of a second group. In this case, the sensing lines RL1 to RL27 of the first group may be disposed at the left side of the touch sensor area TSA, and the sensing lines RL28 to RL40 of the second group may be disposed at the right side of the touch sensor area TSA.

In addition, 27 sensing lines of the first group may be provided, and 3 sensing lines of the second group may be provided. That is, the number of the sensing lines of the first group may be different from the number of the sensing lines of the second group. Since the sensing lines of the second group are longer than the sensing lines of the first group, when the sensing lines of the second group are formed to be wider than the sensing lines of the first group, it is possible to minimize a resistance deviation between the sensing lines of the first group and the sensing lines of the second group.

A first guard line GL1 may be disposed on the right side of the $40^{th}$ sensing line RL40. A third guard line GL3 may be disposed between the first driving line TL1 and the $28^{th}$ sensing line RL28. A second guard line GL2 may be disposed between the $28^{th}$ sensing line RL28 and a second ground line GRL2. A fourth guard line GL4 may be disposed on the left side of the $27^{th}$ sensing line RL27. A fifth guard line GL5 may be disposed to surround right, upper, and left sides of the touch sensor area TSA. The fifth guard line GLS may be connected to one of the first touch pads TP1 and one of the second touch pads TP2. In addition, the fifth guard line GL5 may be disposed between the $27^{th}$ sensing line RL27 and the fourth guard line GL4 and between the $40^{th}$ sensing line RL40 and the first guard line GL1.

A first ground line GRL1 may be disposed on the right side of the first guard line GL1. The second ground line GRL2 may be connected to the second touch pad disposed at a leftmost side among the second touch pads TP2. A third ground line GRL3 may be connected to the first touch pad disposed at a rightmost side among the first much pads TP1. The second ground line GRL2 may be disposed on the left side of the second guard line GL2, and the third ground line GRL3 may be disposed on the right side of the third guard line GL3. The second ground line GRL2 and the third ground line GRL3 may be electrically connected to each other. A fourth ground line GRL4 may be disposed on the left side of the fourth guard line GL4.

The first ground line GRL1 and the fourth ground line GRL4 are disposed at outermost sides of upper, left, and right sides of the display panel 100. The second ground line GRL2 and the third ground line GRL3 are disposed at a lower side of the display panel 100. Accordingly, the touch sensor area TSA, the driving lines TL1 to TL25, and the sensing lines RL1 to RL40 may be disposed to be surrounded by the first ground line GRL1, the second ground line GRL2, the third ground line GRL3, and the fourth ground line GRL4. As a result, when static electricity is applied from the outside, the static electricity may be discharged to the first ground line GRL1, the second ground line GRL2, and the third ground line GRL3. That is, the touch sensor area TSA, the driving lines TL1 to TL25, and the sensing lines RL1 to RL40 may be protected from static electricity.

In addition, the first guard line GL1 may serve to minimize the $28^{th}$ to $40^{th}$ sensing lines RL28 to RL40 from being influenced by a change in voltage of the first ground line GRL1. The third guard line GL3 may serve to minimize the 28th sensing line RL28 and the first driving line TL1 from being influenced by each other. The second guard line GL2 may serve to minimize the $28^{th}$ to $40^{th}$ sensing lines RL28 to RL40 from being influenced by a change in voltage of the second ground. line GRL2. The fourth guard line GL4 may serve to minimize the first to $27^{th}$ sensing lines RL1 to RL27 from being influenced by a change in voltage of the fourth ground line GRL4. The fifth guard line GL5 may serve to minimize the touch sensor area TSA and the sensing lines RL1 to RL40 from being influenced by a change in voltage therearound.

To this end, when the first touch electrodes TE and the second touch electrodes RE are driven through a mutual capacitance method, a ground voltage may be applied to the first guard line GL1, the second guard line GL2, the third guard line GL3, the fourth guard line and the fifth guard line GL5. In addition, when the first touch electrodes TE and the second touch electrodes RE are driven through a self-capacitance method, the same driving signals as driving signals applied to the driving lines TL1 to TL25 and the sensing lines RL1 to RL40 may be applied to the first guard line GL1, the second guard line GL2, the third guard line GL3, the fourth guard line GL4, and the fifth guard line GL5. The mutual capacitance method and the self-capacitance method will be described below with reference to FIG. 6.

The first to 25th driving lines TL1 to TL25, the first to 27th sensing lines RL1 to RL27, the third guard line GL3, the fourth guard line GL4, the third ground line GRL3, and the fourth ground line GRL4 may be connected to the first touch pads TP1. The 28th to 40th sensing lines RL28 to RL40, the first guard line GL1, the second guard line GL2, the fifth guard line GL5, the first ground line GRL1, and the second ground line GRL2 may be connected to the second touch pads TP2.

In the present specification, for convenience of description, although the display pads DP are illustrated only in FIG. 4, and the first touch pads TP1 and the second touch pads TP2 are illustrated only in. FIG. 5, the display pads DP, the first touch pads TP1, and the second touch pads TP2 may be disposed together at an end portion of the protrusion area PA of the display panel 100. In this case, the display pads DP may be disposed between the first touch pads TP1 and the second touch pads TP2. For example, the first touch pads TP1 may be disposed on the left side of the display pads DP, and the second touch pads TP2 may be disposed on the right side of the display pads DP.

Figure 6:
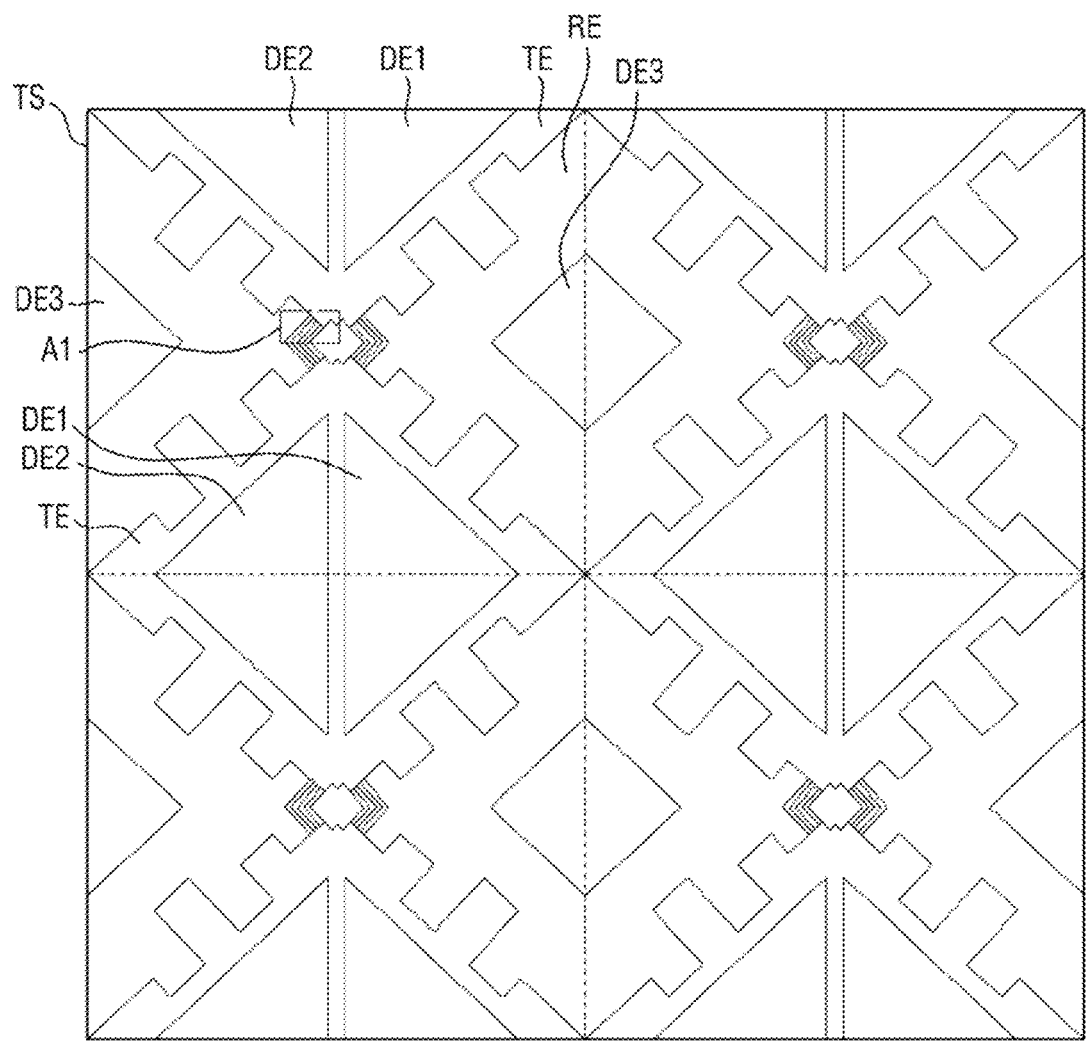
FIG. 6 is an enlarged plan view illustrating an embodiment of touch sensors of FIG. 5.
Figure 7:
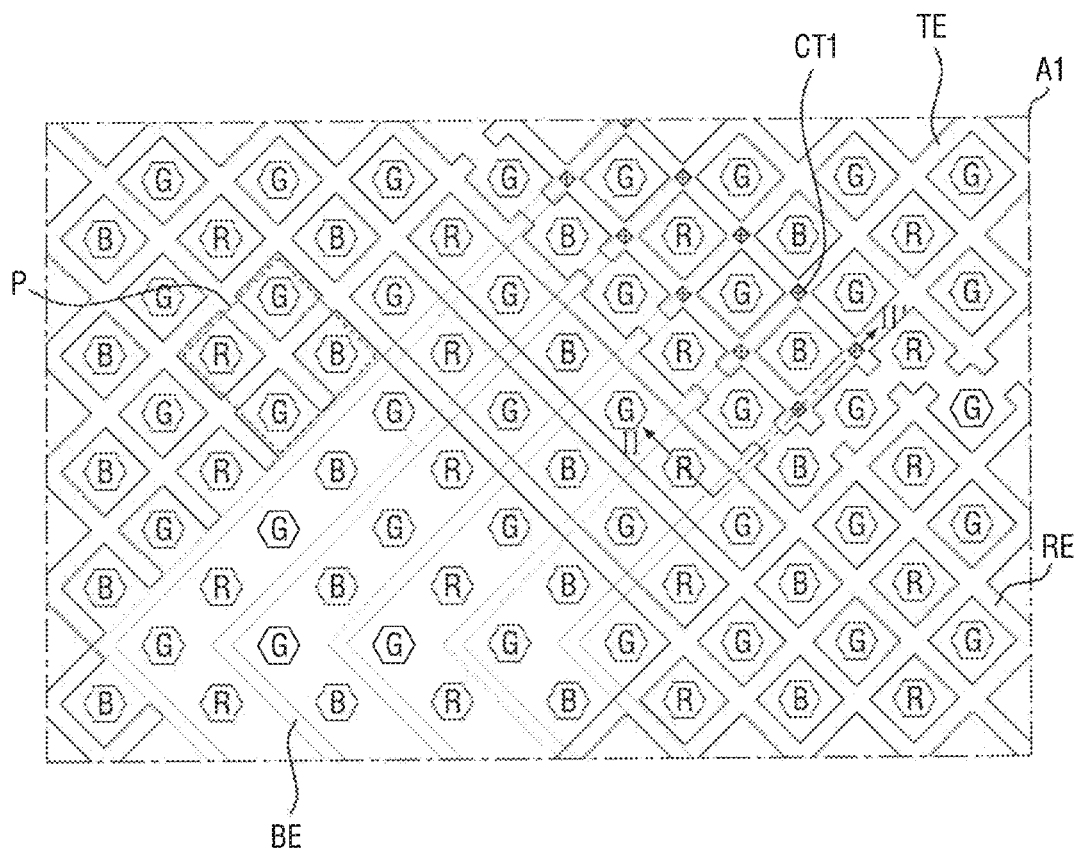
FIG. 7 is an enlarged plan view illustrating an embodiment of area A1 of FIG. 6.

FIG. 6 is an enlarged plan view illustrating an embodiment of the touch sensors of FIG. 5. FIG. 7 is an enlarged plan view illustrating an embodiment of area A1 of FIG. 6.

Referring to FIGS. 6 and 7, the touch sensors TS may include the second touch electrodes RE electrically connected in the first direction (X-axis direction), the first touch electrodes TE electrically connected in the second direction (Y-axis direction), and the connection electrodes BE connecting the first touch electrodes TE adjacent to each other in the second direction (Y-axis direction) so as to prevent a short circuit between the second touch electrodes RE and the first touch electrodes TE in the intersection areas thereof. Since the first touch electrodes TE and the second touch electrodes RE are disposed to be spaced apart from each other by a predetermined interval, the first touch electrodes TE and the second touch electrodes RE may not be electrically connected to each other.

The first touch electrodes TE and the second touch electrodes RE of the touch sensors TS may be driven through a mutual capacitance method or a self-capacitance method. When the first touch electrodes TE and the second touch electrodes RE of the touch sensors TS are driven through the mutual capacitance method, driving signals may be supplied to the first touch electrodes TE through the driving lines TL1 to TL40 to charge mutual capacitances formed between the first touch electrodes TE and the second touch electrodes RE. Then, charge change amounts of the second touch electrodes RE are measured through the sensing lines RL1 to RL40, and whether a touch is input is determined according to the charge change amounts of the second touch electrodes RE. The driving signal may be a signal having a plurality of driving pulses.

Second, when the first touch electrodes TE and the second touch electrodes RE of the touch sensors TS are driven through the self-capacitance method, driving signals may be supplied to all of the first touch electrodes TE and the second touch electrodes RE through the driving lines TL1 to TL25 and the sensing lines RL1 to RL40 to charge self-capacitances of the first touch electrodes TE and the second touch electrodes RE. Then, charge change amounts of the self-capacitances of the first touch electrodes TE and the second touch electrodes RE are measured through the driving lines TL1 to TL25 and the sensing lines RL1 to RL40, and whether a touch is input is determined according to the charge change amounts of the self-capacitances.

As shown in FIG. 7, the first touch electrodes TE and the second touch electrodes RE may be formed as mesh or net-shaped electrodes. When the touch sensor layer TSL including the first touch electrodes TE and the second touch electrodes RE is formed directly on the thin film encapsulation film TFEL as shown in FIG. 3, a distance between a second electrode of the light-emitting element layer EML and the first touch electrodes TE or the second touch electrodes RE of the touch sensor layer TSL may be small. Accordingly, very high parasitic capacitance may be formed between the second electrode of the light-emitting element layer EML and the first touch electrodes TE or the second touch electrodes RE of the touch sensor layer TSL. The parasitic capacitance is proportional to an overlapping area between the second electrode of the light-emitting element layer EMl, and the first touch electrode TE or the second touch electrode RE of the touch sensor layer TSL. Thus, in order to reduce the parasitic capacitance, the first touch electrodes TE and the second touch electrodes RE may be formed as the mesh or net-shaped electrodes rather than box electrodes of a conductive layer made of a transparent oxide such as indium tin oxide (ITO) or indium zinc oxide (IZO).

The connection electrodes BE may be formed to be bent at least once in a shape such as "<" or ">" in a plan view. However, a planar shape of each of the connection electrodes BE is not limited thereto. The connection electrodes BE may be disposed to overlap the first touch electrodes TE and the second touch electrodes RE. As shown in FIG. 7, each of the connection electrodes RE may be connected to the first touch electrodes TE through first contact holes CH in areas thereof overlapping the first touch electrodes TE.

As shown in FIG. 6, dummy electrodes (or floating electrodes, DE1, DE2, and DE3 may be disposed to be spaced apart from the first touch electrodes TE and the second touch electrodes RE. The dummy electrodes DE1, DE2, and DE3 may be disposed to be surrounded by the first touch electrode TE or the second touch electrode RE. The dummy electrodes DE1, DE2, and DE3 may be formed as mesh or net-shaped electrodes. No voltage is applied to the dummy electrodes DE1, DE2, and DE3. As an area of the dummy electrodes DE1, DE2, and DE3 is increased, the parasitic capacitance between the second electrode of the light-emitting element layer EMU and the first touch electrodes TE or the second touch electrodes RE of the touch sensor layer may be decreased, and the mutual capacitance between the first touch electrodes TE and the second touch electrodes RE may be decreased. When the parasitic capacitance is decreased, a charging speed at which the mutual capacitance is charged may increase. However, when the mutual capacitance is decreased, an influence of touch noise may increase. Therefore, the area of the dummy electrodes DE1, DE2, and DE3 may be appropriately set in consideration of the parasitic capacitance and the mutual capacitance.

Since the first touch electrodes TE and the second touch electrodes RE are formed in a mesh shape or a net shape, subpixels R, G, and B may be disposed to not overlap, the first touch electrodes TE and the second touch electrode RE. That is, the subpixels R, G, and B may be disposed in areas disposed in a matrix form due to the first touch electrodes TE and the second touch electrodes RE having the mesh shape or the net shape.

The subpixels R, G, and B may include first subpixels R emitting first color light, second subpixels G emitting second color light, and third subpixels B emitting third color light. In the present specification, the first subpixel R is described as a red subpixel, the second subpixel G is described as a green subpixel, and the third subpixel B is described as a blue subpixel. However, the present disclosure is not limited thereto. One first subpixel two second subpixels G, and one third subpixel B may be defined as one pixel P. The pixel P refers to a group of subpixels capable of expressing grayscale.

In FIG. 7, the first subpixel R, the second subpixel G, and the third subpixel B are illustrated as having a hexagonal planar shape. However, the present disclosure is not limited thereto. The first subpixel R, the second subpixel G, and the third subpixel B may have another polygonal, circular, or elliptical planar shape other than a hexagonal shape. In addition, FIG. 7 illustrates that a size of the third subpixel B is the largest and a size of the second subpixel G is the smallest. However sizes of the subpixels R, G, and B are limited thereto.

Figure 8:
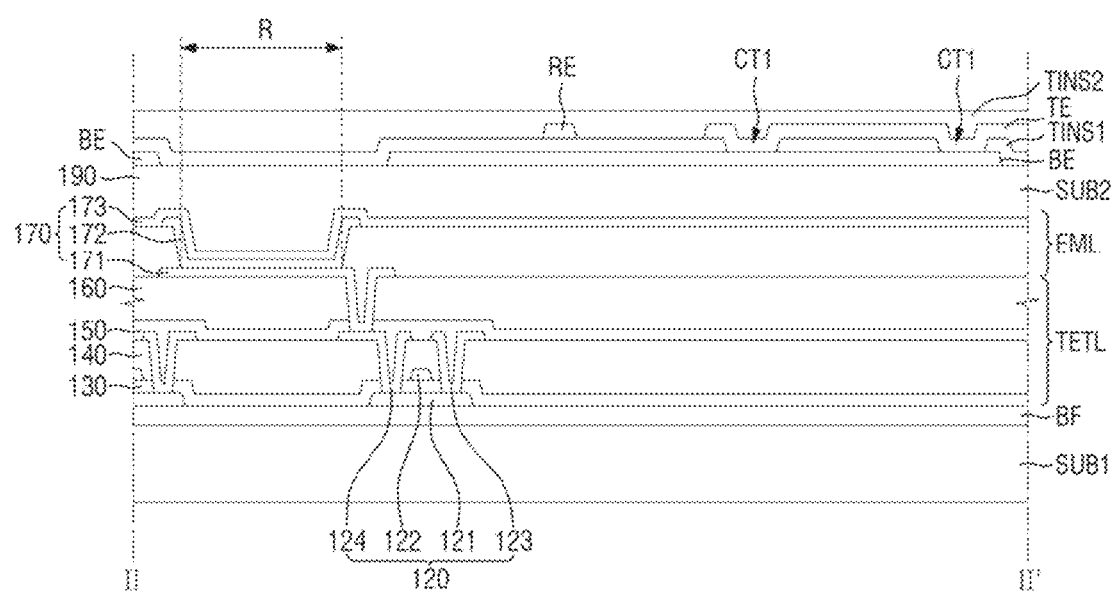
FIG. 8 is a cross-sectional view of an embodiment which is taken along line II-II' of FIG. 7.

FIG. 8 is a cross-sectional view of an embodiment which is taken along line II-II' of FIG. 7.

Referring to FIG. 8, the thin film transistor layer TFTL is formed on the substrate SUB. The thin film transistor layer TFTL includes thin film transistors 120, a gate insulating film 130, an interlayer insulating film 140, a protective film 150, and a planarizing film 160.

buffer film BF may be formed on a first surface of the substrate SUB. The buffer film BF may be formed on a first surface of the substrate SUB to protect the thin film transistors 120 and an organic light-emitting layer 172 of the light-emitting element layer EML from moisture permeating through the substrate SUB which is vulnerable to moisture transmission. The buffer film BF may include a plurality of inorganic films which are alternately stacked. For example, the butler film BF may be formed as a multi layer film in which one or more inorganic films among a silicon nitride laver, a silicon oxynitride layer, a silicon oxide layer, a titanium oxide layer, and an aluminum oxide layer are alternately stacked. The buffer film BF may be omitted.

The thin film transistor 120 is formed on the buffer film BF The thin film transistor 120 includes an active layer 121, a gate electrode 122, a source electrode 123, and a drain electrode 124. In FIG. 8, the thin film transistor 120 is illustrated as being formed as a top gate type in which the gate electrode 122 is disposed above the active layer 121. However, the present disclosure is not limited thereto. That is, the thin film transistors 120 may be formed as a bottom gate type in which the gate electrode 122 is disposed below the active layer 121 or a double gate type in which the gate electrode 122 is disposed on both of upper and lower portions of the active layer 121.

The active layer 121 is formed on the buffer film. The active layer 121 may include polycrystalline silicon, single crystal silicon, low temperature polycrystalline silicon, amorphous silicon, or an oxide semiconductor. For example, the oxide semiconductor may include a binary compound ($AB_x$), a ternary compound ($AB_xC_y$), or a quaternary compound ($AB_xC_yD_z$) which includes indium, zinc, gallium, tin, titanium, aluminum, hafnium (Hf), zirconium (Zr), magnesium (Mg), or the like. For example, the active layer 121 may include ITZO (an oxide including indium, tin, and titanium) or IGZO (an oxide including indium, gallium, and tin). A light blocking layer configured to block external light incident on the active layer 121 may be formed between the buffer film and the active layer 121.

The gate insulating film 130 may be formed on the active layer 121. The gate insulating film 130 may be formed as an inorganic film, for example, a silicon nitride layer, a silicon oxynitride layer, a silicon oxide layer, a titanium oxide layer, or an aluminum oxide layer.

The gate electrode 122 and a gate line may be formed on the gate insulating film 130. The gate electrode 122 and the gate line may be formed as a single layer or a multi-layer made of one selected from among molybdenum (Mo), aluminum (Al), chromium (Cr), gold (Au), titanium (Ti), nickel (Ni), neodymium (Nd), and copper (Cu), or an alloy thereof.

The interlayer insulating film 140 may be formed on the gate electrode 122 and the gate line. The interlayer insulating film 140 may be formed as an inorganic film, for example, a silicon nitride layer, a silicon oxynitride layer, a silicon oxide layer, a titanium oxide layer, or an aluminum oxide layer.

The source electrode 123 and the drain electrode 124 may be formed on the interlayer insulating film 140. Each of the source electrode 123 and the drain electrode 124 may be connected to the active layer 121 through a contact hole passing through the gate insulating film 130 and the interlayer insulating film 140. The source electrode 123 and the drain electrode 124 may be formed as a single layer or a multi-layer made of one selected from among molybdenum (Mo), aluminum (Al), chromium (Cr), gold (Au), titanium (Ti), nickel (Ni), neodymium (Nd), and copper (Cu), or an alloy thereof.

The protective film 150 may be formed on the source electrode 123 and the drain electrode 124 to insulate the thin film transistor 120. The protective film 150 may be formed as an inorganic film, for example, a silicon nitride layer, a silicon oxynitride layer, a silicon oxide layer, a titanium oxide layer, or an aluminum oxide layer.

The planarizing film 160 may be formed on the protective film 150 to planarize a stepped portion due to the thin film transistor 120. The planarizing film 160 may be formed as an organic film made of acryl resin, epoxy resin, phenolic resin, polyamide resin, PI resin, or the like/

The light-emitting element layer EML may be formed on the thin film transistor layer TFTL. The light-emitting element layer EML includes light-emitting elements 170 and a pixel definition film 180.

The light-emitting elements 170 and the pixel definition film 180 are formed on the planarizing film 160. Each of the light-emitting elements 170 ma include a first electrode 171, the organic light-emitting layer 172, and a second electrode 173.

The first electrode 171 may be formed on the planarizing film 160. The first electrode 171 is connected to the source electrode of the thin film transistor 120 through a contact hole passing through the protective film 150 and the planarizing film 160.

In a top emission structure in which light is emitted in a direction from the organic light-emitting layer 172 toward the second electrode 173, the first electrode 171 may be made of a metal material having high reflectivity and, for example, may include a stacked structure (Ti/Al/Ti) including aluminum and titanium, a stacked structure (ITO/Al/ITO) including aluminum and ITO, a silver-palladium-copper (APC) alloy, or a stacked structure (ITO/APC/ITO) including an APC alloy and ITO. The APC alloy is an alloy of silver (Ag), palladium (Pd), and copper (Cu).

in a bottom emission structure in which light is emitted in a direction from the organic light-emitting layer 172 toward the first electrode 171, the first electrode 171 may be made of a transparent conductive material (TCO) capable of transmitting light, such as ITO or IZO or may be made of a semi-transmissive conductive material such as magnesium (Mg), silver (Ag), or an alloy of magnesium (Mg) and silver (Ag). In this case, when the first electrode 171 is made of the semi-transmissive conductive material, luminous efficiency may be improved due to a microcavity.

In order to serve as a pixel definition film configured to define the subpixels R, G, and B, the pixel definition film 180 may be formed to partition the first electrode 171 on the planarizing film 250. The pixel definition film 180 may be formed to cover an edge of the first electrode 171. The pixel definition film 180 may be formed as an organic film made of acryl resin, epoxy resin., phenolic resin, polyamide resin, PI resin, or the like.

Each of the subpixels R, G, and B refers to an area in which the first electrode 171, the organic light-emitting layer 172, and the second electrode 173 are sequentially stacked and holes from the first electrode 171 and electrons from the second electrode 173 are combined with each other in the organic light-emitting layer 172 to emit light. In FIG. 8, only the first subpixel R is illustrated for convenience of description. However, the second subpixel G and the third subpixel B may be formed substantially the same as the first subpixel R.

The organic light-emitting layer 172 is formed on the first electrode 171 and the pixel definition film 180. The organic light-emitting layer 172 may include an organic material to emit certain color light. For example, the organic light-emitting layer 172 may include a hole transport layer, an organic material layer, and an electron transport layer. In this case, the organic light-emitting layer 172 of the red subpixel R may emit red light, the organic light-emitting layer 172 of the green subpixel G may emit green light, and the organic light-emitting layer 172 of the blue subpixel B 172 may emit blue light. Alternatively, the organic light-emitting layers 172 of the subpixels R, G, and B may emit white light. In this case, the red subpixel R may further include a red color filter layer, the green subpixel G may further include a green color filter layer, and the blue subpixel B may further include a blue color filter layer.

The second electrode 173 is formed on the organic light-emitting layer 172. The second electrode 173 may be formed to cover the organic light-emitting layer 172. The second electrode 173 may be a common layer commonly formed in the pixels P. A capping layer may be formed on the second electrode 173.

In a top emission structure, the second electrode 173 may be made of a TCO capable of transmitting light, such as ITO or IZO or may be made of a semi-transmissive conductive material such as magnesium (Mg), silver (Ag), or an alloy of magnesium (Mg) and silver (Ag). When the second electrode 173 is made of the semi-transmissive conductive material, luminous efficiency may be improved due to a microcavity.

In a bottom emission structure, the second electrode 173 may be made of a metal material having, high reflectivity and, for example, may include a stacked structure (Ti/Al/Ti) including aluminum and titanium, a stacked structure (ITO/Al/ITO) including aluminum and 110 an APC alloy or a stacked structure (ITO/APC/ITO) including aa. APC alloy and ITO. The APC alloy is an alloy of silver (Ag), palladium (Pd), and copper (Cu).

The thin film encapsulation layer TFEL is formed on the light-emitting element layer EML. The thin film encapsulation layer TFEL includes an encapsulation film 190.

The encapsulation film 190 is disposed on the second electrode 173. The encapsulation film 190 may include at least one inorganic film so as to prevent oxygen or moisture from permeating into the organic light-emitting layer 172 and the second electrode 173. In addition, the encapsulation film 190 may include at least one organic film so as to protect the light-emitting element layer EML from foreign materials such as dust. For example, the encapsulation film 190 may include a first inorganic film disposed on the second electrode 173, an organic film disposed on the first inorganic film, and a second inorganic film disposed on the organic film. The first inorganic film and the second inorganic film may be formed as a silicon nitride layer, a silicon oxynitride layer, a silicon oxide layer, a titanium oxide layer, or an aluminum oxide layer, but the present disclosure is not limited thereto. The organic film may be made of acryl resin, epoxy resin, phenolic resin, polyamide resin, PI resin, or the like. However, the present disclosure is not limited thereto.

The touch sensor layer TSL is formed on the thin film encapsulation layer TFEL. As described with reference to FIG. 5, the touch sensor layer TSL includes the first touch electrodes TE, the second touch electrodes RE, the connection electrodes BE, the driving lines TL1 to TL25, the sensing lines RL1 to RL40, the guard lines GL1, GL2, GL3, GL4, and GL5, and the around lines GRL1, GRL2, GRL3, and GRL4. For convenience of description, only the first touch electrode TE, the second touch electrode RE, and the connection electrode BE of the touch sensor layer TSL are illustrated in FIG. 8. A buffer flax may be additionally formed on the encapsulation film 190.

The connection electrodes BE are formed an the encapsulation film 190 or the additional buffer film. The connection electrodes BE may be formed to include a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO. However, the present disclosure is not limited thereto.

A first touch insulating film TINS1 is formed on the connection electrodes BE. The first touch insulating, film TINS1 may be formed as an inorganic film, for example, a silicon nitride layer, a silicon oxynitride layer, a silicon oxide layer, a titanium oxide layer, or an aluminum oxide layer. Alternatively, the first touch insulating film TINS1 may be formed as an organic film made of acryl resin, epoxy resin phenolic resin, polyamide resin, PI resin, or the like.

The first touch electrodes TE and the second touch electrodes RE may be formed on the first touch insulating film TINS1. The first touch electrode TE and the second touch electrode RE may be formed to include a stacked structure (Ti/Al/Ti) including aluminum and titanium a stacked structure (ITC/Al/ITO) including aluminum and ITO, an APC alloy, or a stacked structure (ITO/APC/ITO) including a APC alloy and ITO. However, the present disclosure is not limited thereto.

The first contact holes CT1 may be formed in the first touch insulating film TINS1 so as to pass completely through the first touch insulating film TINS1 to expose the connection electrodes BE. The first touch electrodes TE may be connected to the connection electrode BE through the first contact holes CT1.

A second touch insulating film TINS2 is formed on the first touch electrodes h and the second touch electrodes RE. The second touch insulating film TINS2 may serve to planarize stepped portions formed due to the first touch electrode TE, the second touch electrode RE, and the connection electrode BE. The second touch insulating film TINS2 may be formed as an organic film made or acryl resin, epoxy resin, phenolic resin, polyamide resin, PI resin, or the like.

According to the exemplary embodiment shown in FIG. 8, since the first touch electrodes TE and the second touch electrodes RE are formed directly on the encapsulation film 190, a thickness of the display device 10 may be reduced as compared with a case in which a separate touch panel including the first touch electrodes TE and the second touch electrodes RE is attached onto the encapsulation film 190.

In addition, according to the exemplary embodiment shown in FIGS. 7-8, the first touch electrodes TE and the second touch electrodes RE are formed as mesh or net-shaped electrodes and disposed to overlap the pixel definition film 180. Thus, it is possible to prevent reductions in aperture areas of the subpixels R, G, and B. Furthermore, it is possible to decrease a parasitic capacitance between the first and second touch electrodes TE and RE and the second electrode 173.

Figure 9:
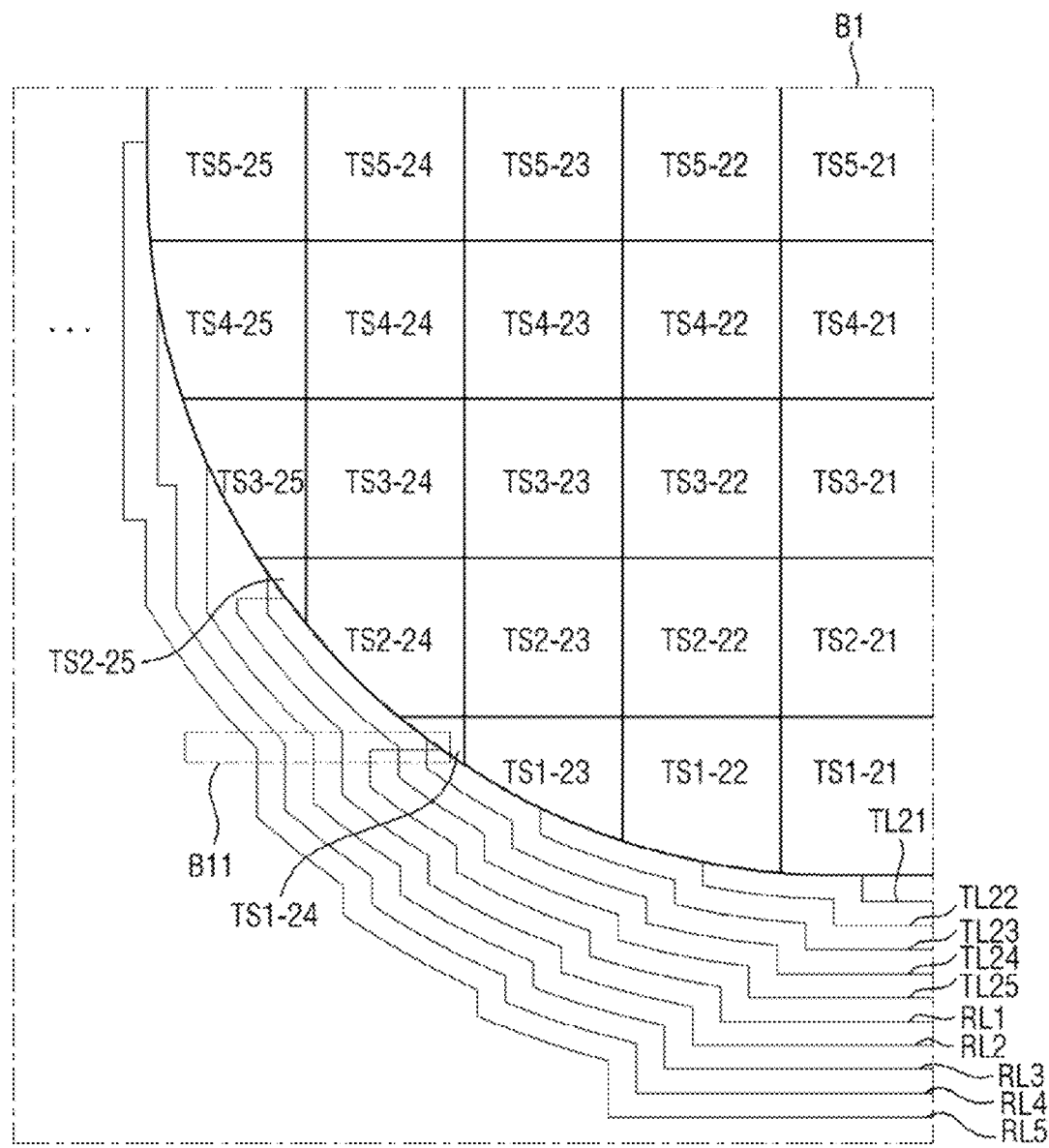
FIG. 9 is an enlarged plan view illustration an embodiment of area B1 of FIG. 5.

FIG. 9 is an enlarged plan view illustrating an embodiment of area B1 of FIG. 5. FIG. 9 is an enlarged plan view illustrating the third round portion RD3 of the touch sensor area TSA.

For convenience of description, only the touch sensors TS, the $21^{st}$ to $25^{th}$ driving lines TL21 to TL25 connected to the touch sensors TS of the third round portion RD3, and the first to fifth sensing lines RL1 to RL5 connected to the touch sensors TS of the third round portion RD3 are illustrated in FIG. 9. In addition, in FIG. 9, for convenience of description, a touch sensor disposed in an $i^{th}$ row and a $j^{th}$ column will be described as an $i^{th}$-$j^{th}$ touch sensor. For example, a touch sensor disposed in a first row and a $25^{th}$ column will be described as a first-$25^{th}$ touch sensor TS1-25.

Referring to FIG. 9, a first-$22^{nd}$ touch sensor TS1-22, a first-$23^{rd}$ touch sensor TS1-23, a first-$24^{th}$ touch sensor TS1-24, a second-$24^{th}$ touch sensor TS2-24, a second-$25^{th}$ touch sensor TS2-25, a third-$25^{th}$ touch sensor TS3-25, and a fourth-$25^{th}$ touch sensor TS4-25 are disposed in the third round portion RD3 and thus cannot have a quadrangular shape. Similarly, the touch sensors TS disposed in the first round portion RD1, the second round portion RD2, and the third round portion RD3 also cannot have a quadrangular shape.

Therefore, a planar shape of the touch sensors TS disposed in the first round portion RD1, the second round portion RD2, the third round portion RIB, or the fourth round portion RD4 may be different from a planar shape of the touch sensors TS disposed to areas excluding the first round portion RD1, the second round portion RD2, the third round portion RD3, and the fourth round portion RD4. That is, the planar shapes of the touch sensors TS may be different according to arrangement positions in the first round portion RD1, the second round port RD2, the third round portion RD3, or the fourth round portion RD4.

In addition, an area of the touch sensors TS disposed in the first round portion RD1, the second round portion RD2, the third round portion RD3, or the fourth round portion RD4 may be different from an area of the touch sensors TS disposed in the areas excluding the first round portion RD1, the second round portion RD2, the third round portion RD3, and the fourth round portion RD4. That is, the areas of the touch sensors TS may be different according to the arrangement positions in the first round portion RD1, the second round portion RD2, the third round portion RD3 or the fourth round portion RD4.

As shown in FIG. 9, the $21^{st}$ driving line TL21 may be connected to a first-$21^{st}$ touch sensor TS1-21 and the $22^{nd}$ driving line TL22 may be connected to the first-$22^{nd}$ touch sensor TS1-22. The $23^{rd}$ driving line TL23 may be connected to the first-$23^{rd}$ touch sensor TS1-23, and the $24^{th}$ driving TL24 may be connected to the first-$24^{th}$ touch sensor TS1-24. The $25^{th}$ driving line TL25 may be connected to the second-$25^{th}$ touch sensor TS2-25.

That is, the second to $24^{th}$ driving lines TL2 to TL24 may be connected to first-second to first-$24^{th}$ touch sensors TS1-2 to TS1-24 disposed in the first row, respectively. In addition, since, due to a curvature of the third round portion RD3 and a curvature of the fourth round portion RD4, a first-first touch sensor TS1-1 and a first-$25^{th}$ touch sensor TS1-25 are not present, the first driving line TL1 may be connected to a second-first touch sensor TS2-1 disposed in a second row, and the $25^{th}$ driving line TL25 may be connected to a second-$25^{th}$ touch sensor TS2-25 disposed in the second row.

As shown in FIG. 9, since, due to the curvature of the third round portion RD3, the first-$25^{th}$ touch sensor TS1-25 is not present, the first sensing line RL1 may be connected to the first-$24^{th}$ touch sensor TS1-24. The second sensing line RL2 may be connected to the second $25^{th}$ touch sensor TS2-25, and the third sensing line RL3 may be connected to the third-$25^{th}$ touch sensor TS3-25. The fourth sensing line RL4 may be connected to the fourth-$25^{th}$ touch sensor TS4-25, and the fifth sensing line RL5 may be connected to a fifth-$25^{th}$ touch sensor TS5-25.

That is, the second to $27^{th}$ sensing lines RL2 to RL27 may be connected to second-$25^{th}$ to $27^{th}$-$25^{th}$ touch sensors TS2-25 to TS27-25 disposed in a $25^{th}$ row, respectively. In addition, since, due to the curvature of the third round portion RD3 the first-$25^{th}$ touch sensor TS1-25 is not present, the first sensing line RL1 may be connected to the first-$24^{th}$ touch sensor TS1-24 disposed in a $24^{th}$ column.

Similarly, the $28^{th}$ to $39^{th}$ sensing lines RL28 to RL39 may be connected to $28^{th}$-first to $39^{th}$-first touch sensors TS28-1 to TS39-1 disposed in a first column, respectively. In addition, since, due to a curvature of the second round portion RD2, a $40^{th}$-first touch sensor TS40-1 is not present, the $40^{th}$ sensing line RL40 may be connected to a $39^{th}$ second touch sensor TS39-2 disposed in a $39^{th}$ column, As described above, since, due to the curvature of the third round portion RD3, the first sensing line RL1 is connected to the first-$24^{th}$ touch sensor. TS1-24 disposed in the $24^{th}$ column, and the $25^{th}$ driving line TL25 may be connected to the second-$25^{th}$ touch sensor TS2-25 disposed in the $25^{th}$ column. Accordingly, the first sensing line RL1 may intersect at least one driving line. For example, as shown in FIG. 9, the first sensing line RL1 may intersect the $24^{th}$ driving line TL24 and the $25^{th}$ driving line TL25. In addition, the second sensing line RL2 may intersect the $25^{th}$ driving line TL25.

Figure 10:
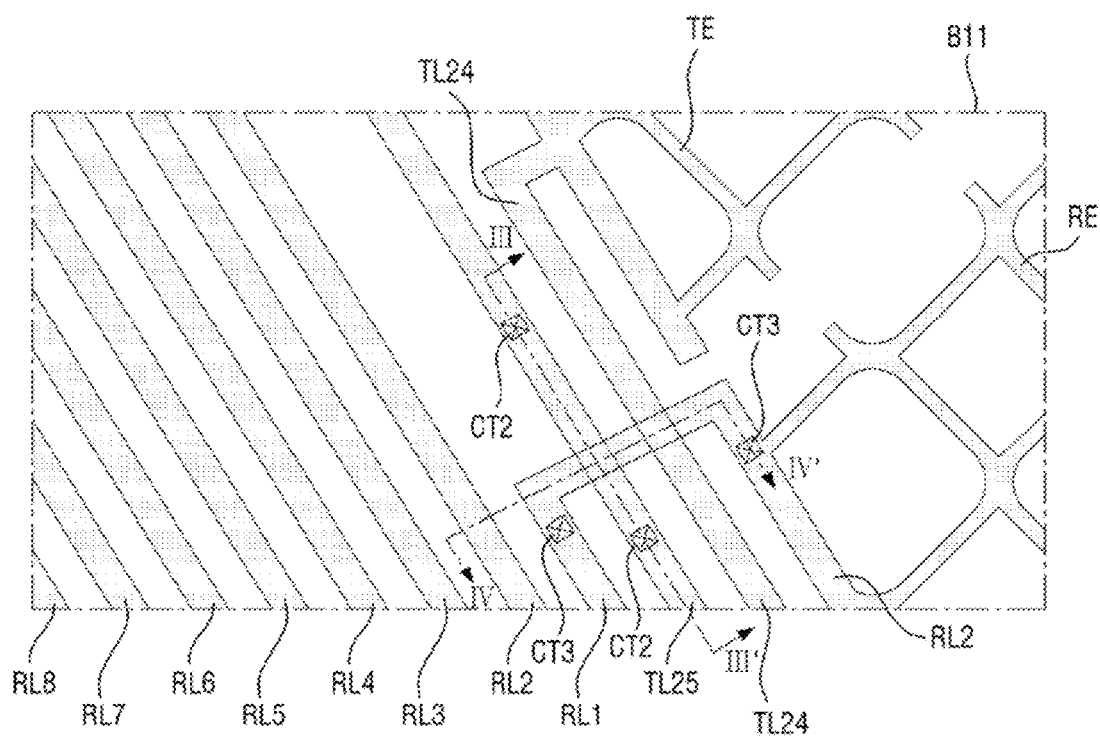
FIG. 10 is an enlarged plan view illustrating an embodiment of area B11 of FIG. 9.
Figure 11:
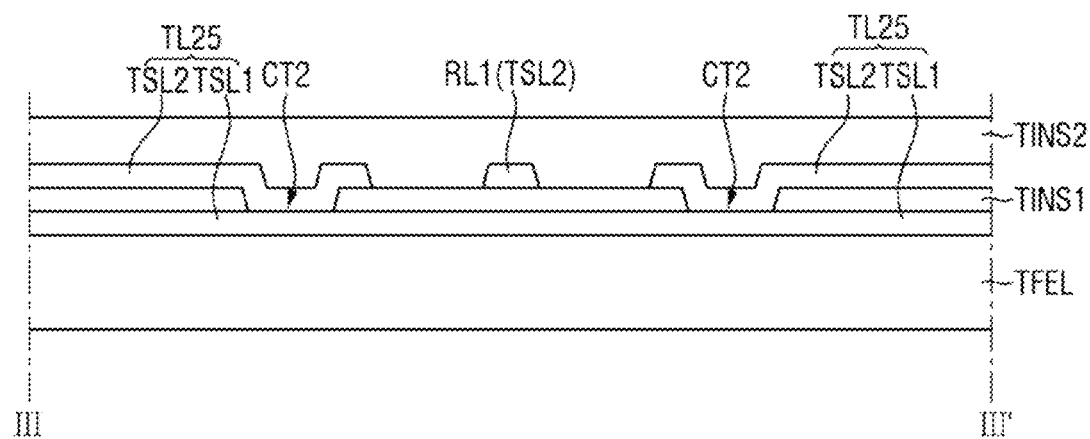
FIG. 11 is as cross-sectional view of an embodiment which is taken along line III-III' of FIG. 10.
Figure 12:
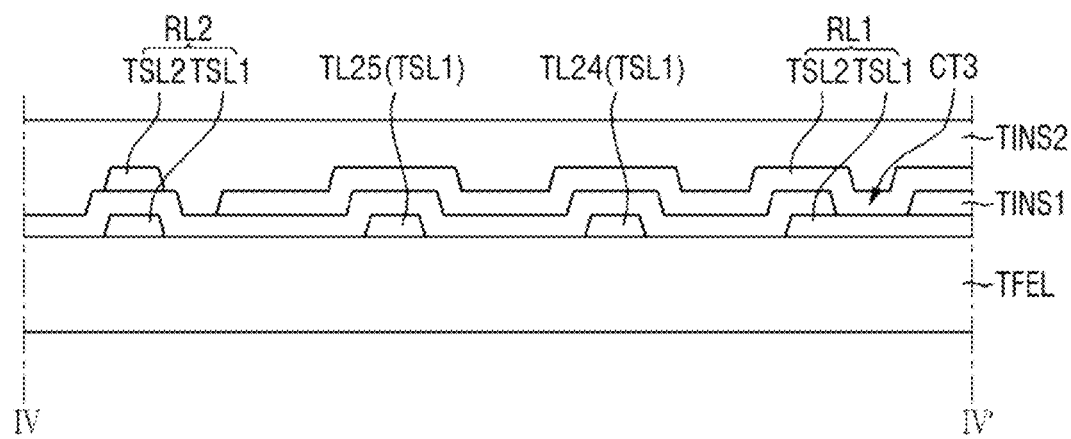
FIG. 12 is a cross-sectional view of an embodiment which is taken along line IV-IV' of FIG. 10.

FIG. 10 is an enlarged plan view illustrating an embodiment of area B11 of FIG. 9. FIG. 11 is a cross-sectional view of an embodiment which is taken along line III-III' of FIG. 10. FIG. 12 is a cross-sectional view of an embodiment which is taken along line IV-IV' of FIG. 10.

Referring to FIGS. 10 to 12, the first to $25^{th}$ driving lines TL1 to TL5 and the first to $40^{th}$ sensing lines RL1 to RL40 may include a plurality of touch signal layers so as to lower resistance. FIG. 12 illustrates that the first sensing line RL1 and the second sensing line RL2 include first touch signal layers TSL1 and second touch signal layers TSL2. The first to $25^{th}$ driving lines TL1 to TL25 and the third to $40^{th}$ sensing lines RL3 to RL4 may also include the first touch signal layers TSL1 and the second touch signal layers TSL2 like the first sensing line RL1 and the second sensing line RL2.

The first touch signal layer TSL1 may be formed on the encapsulation film 190 or the additional buffer film. The first touch signal layer TSL1 may be made of the same material as the connection electrodes BE, to be coplanar with each other. The first touch signal layer TSL1 may be formed to include a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO. However, the present disclosure is clot limited thereto.

The second touch signal layer TSL2 may be formed on the first touch insulating film TINS1. The second touch signal layer TSL2 may be made of the same material as the first touch electrodes TE to be coplanar with each other, the second touch electrodes RE, the first to $25^{th}$ driving lines TL1 to TL25. the first to $40^{th}$ sensing lines RL1 to RL40, the guard lines GL1, GL2, GL3, GL4, and GL5, and the ground lines GRL1, GRL2, GRL3, and GRL4. The second touch signal layer TSL2 may be formed to include a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO. However, the present disclosure is not limited thereto.

Second contact holes CT2 may be formed in the first touch insulating film TINS1 so as to pass through the first insulating film INS1 to expose the first touch signal layer TSL1. The second touch signal layer TSL2 may be connected to the first touch signal layer TSL1 through the second contact holes CT2. An interval between the second contact holes CT2 may be in a range of several ten μm to several thousand μm.

The first sensing line RL1 may intersect the $24^{th}$ driving line TL24 and the $25^{th}$ driving line TL25 to be connected to the second touch electrode RE of the first-$24^{th}$ touch sensor TS1-24. The $24^{th}$ driving line TL24 may be connected to the first touch electrode TE of the first-$24^{th}$ touch sensor TS1-24.

Figure 13:
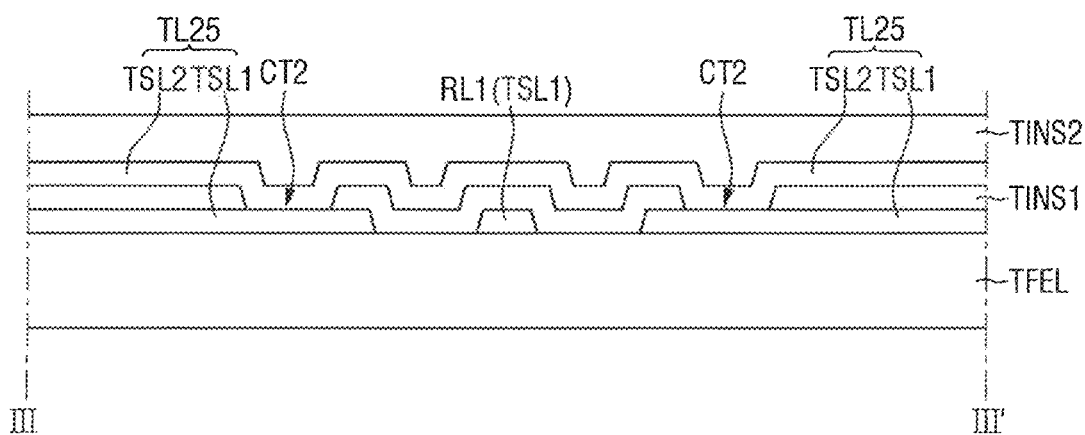
FIG. 13 is a cross-sectional view of another embodiment which is taken along line III-III' of FIG. 10.
Figure 14:
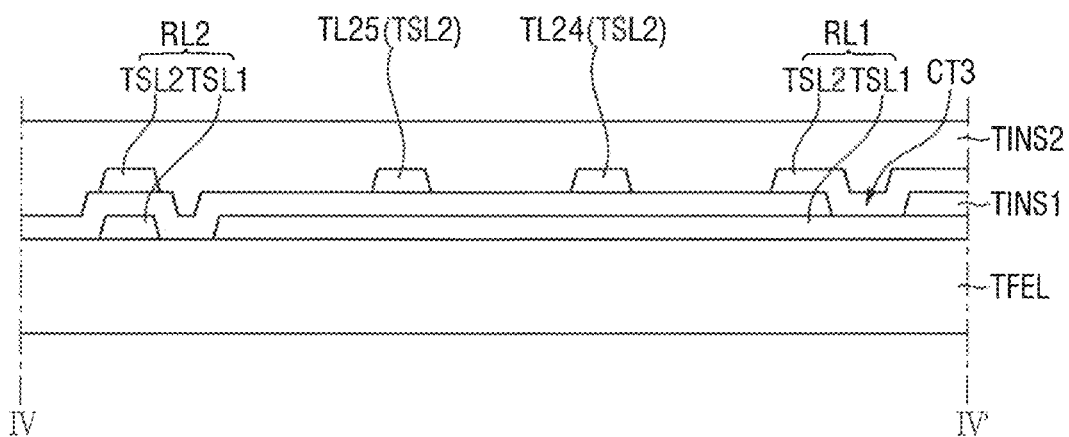
FIG. 14 is a cross-sectional view of another embodiment which is taken along line IV-IV' of FIG. 10.

In order to prevent the first sensing line RL1 from being short-circuited with the $24^{th}$ driving line TL24 or the $25^{th}$ driving line TL25, the first sensing line RL1 may include only one of the first touch signal layer TSL1 and the second touch signal layer TSL2 in intersection areas between the first sensing line RL1 and the $24^{th}$ driving line TL24 and the $25^{th}$ driving line TL25. In this case, the $24^{th}$ driving line TL24 and the $25^{th}$ driving line TL25 may include only the other of the first touch signal layer TSL and the second touch signal layer TSL2 in the intersection areas. For example. as shown in FIGS. 11 and 12, the second touch sensor layer TSL2 of the first sensing, line RL1 may intersect the first touch sensor layer TSL1 of the $24^{th}$ driving line 1124 and the first touch sensor layer TSL1 of the $25^{th}$ driving line TL25. Alternatively, as shown in FIGS. 13 and 14, the first touch signal layer TSL1 of the first sensing line RL1 may intersect the second touch sensor layer TSL2 of the $24^{th}$ driving line TL24 and the second touch sensor layer TSL2 of the $25^{th}$ driving line TL25.

According to the exemplary embodiment illustrated in FIGS. 10 to 12, since driving lines and sensing lines include a plurality of touch signal layers, it is possible to lower resistance. Therefore, a speed at which mutual capacitance is charged by a driving signal may be increased without lowering a frequency of the driving signal, thereby increasing touch sensitivity.

In addition, according to the exemplary embodiment shown in FIGS. 10 to 12, in an intersection area between a driving line and a sensing line, the driving line may include one of a first touch signal layer and a second touch signal layer, and the sensing line may include the other of the first touch signal layer and the second touch signal layer. Accordingly, a short circuit between the driving line and the sensing line connected to touch sensors disposed in a round portion can be prevented so that the touch sensors can be disposed to detect a touch input in the round portion formed with a predetermined curvature.

Figure 15:
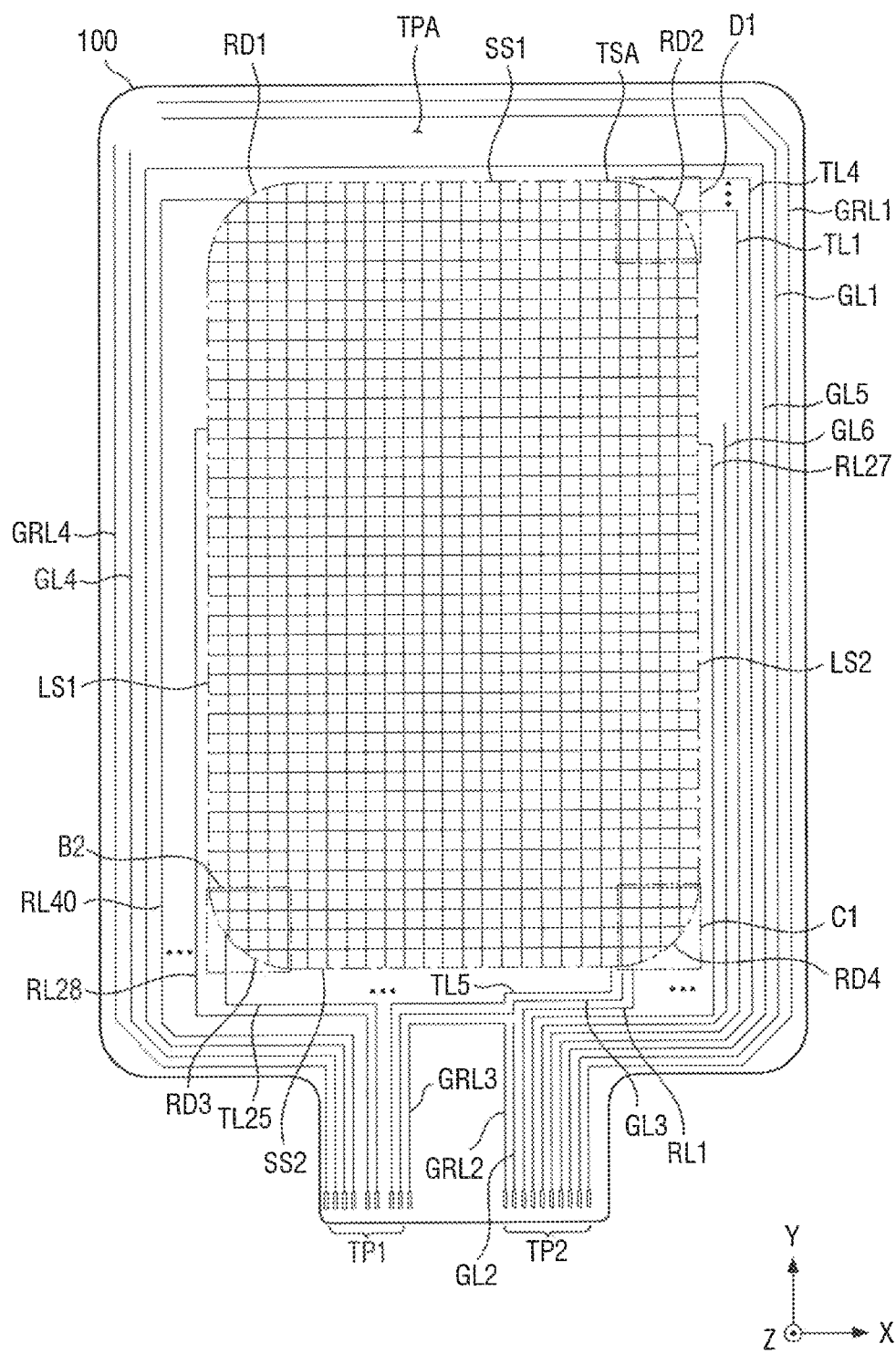
FIG. 15 is a plan view illustrating another embodiment of a touch sensing unit of FIG. 3 in detail.

FIG. 15 is a plan view illustrating another embodiment of the touch sensing unit of FIG. 3 in detail.

The exemplary embodiment shown in FIG. 15 is different from the exemplary embodiment shown in FIG. 5 in that driving lines and sensing lines are disposed so as to not intersect each other. Therefore, in the exemplary embodiment shown in FIG. 15, descriptions duplicated with those of the exemplary embodiment shown in FIG. 5 will be omitted.

Referring to FIG. 15, first to $27^{th}$ sensing lines RL1 to RL27 are disposed at a right side of a touch sensor area TSA, and $28^{th}$ to $40^{th}$ sensing lines RL28 to RL40 are disposed at a left side of the touch sensor area TSA. Since the first to $27^{th}$ sensing lines RL1 to RL27 are disposed at the right side of the touch sensor area TSA, the driving lines and the sensing lines do not intersect each other in a third round portion RD3. Instead, since the first to $27^{th}$ sensing lines RL1 to RL27 are disposed at the right side of the touch sensor area TSA, the first to fourth sensing lines RL1 to RL4 may be connected to touch sensors TS in a fourth round portion RD4, in this case, in order to prevent the driving lines from intersecting the sensing lines in the fourth round portion. RD4 the first to fourth driving lines TL1 to TL4 may be connected to the touch sensors TS in a second round portion RD2.

Figure 16:
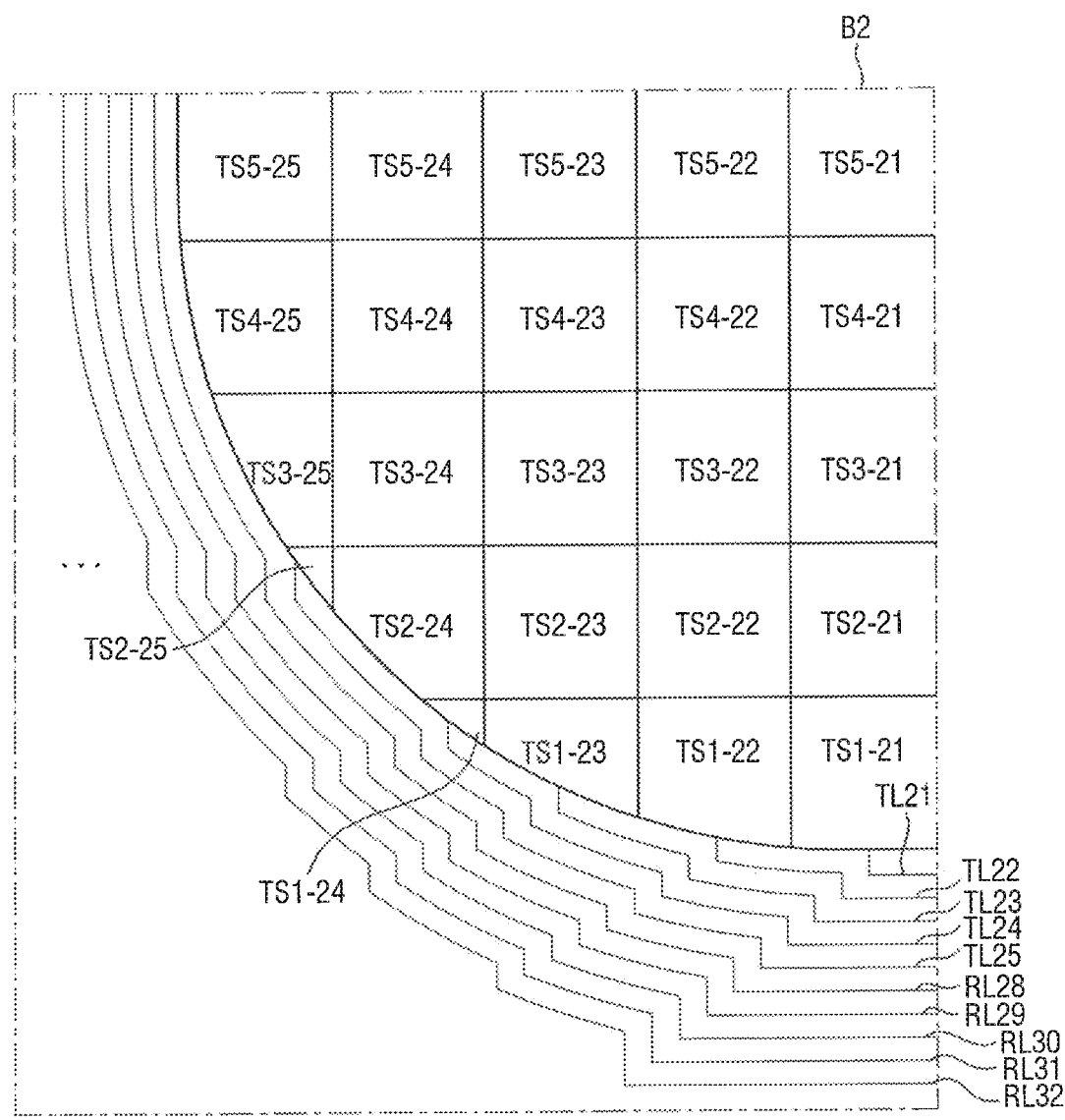
FIG. 16 is an enlarged plan view illustrating an embodiment of area B2 of FIG. 15.

For example, as shown in FIG. 16, a $21^{st}$ driving line TL21 may be connected to a first-$21^{st}$ touch sensor TS1-21 and a $22^{nd}$ driving line TL22 may be connected to a first-$22^{nd}$ touch sensor TS1-22. A $23^{rd}$ driving, line TL23 may be connected to a first-$23^{rd}$ touch sensor TS1-23, and a $24^{th}$ driving line TL24 may be connected to a first-$24^{th}$ touch sensor TS1-24. A $25^{th}$ driving line 1125 may be connected to a second-$25^{th}$ touch sensor TS2-25.

Figure 17:
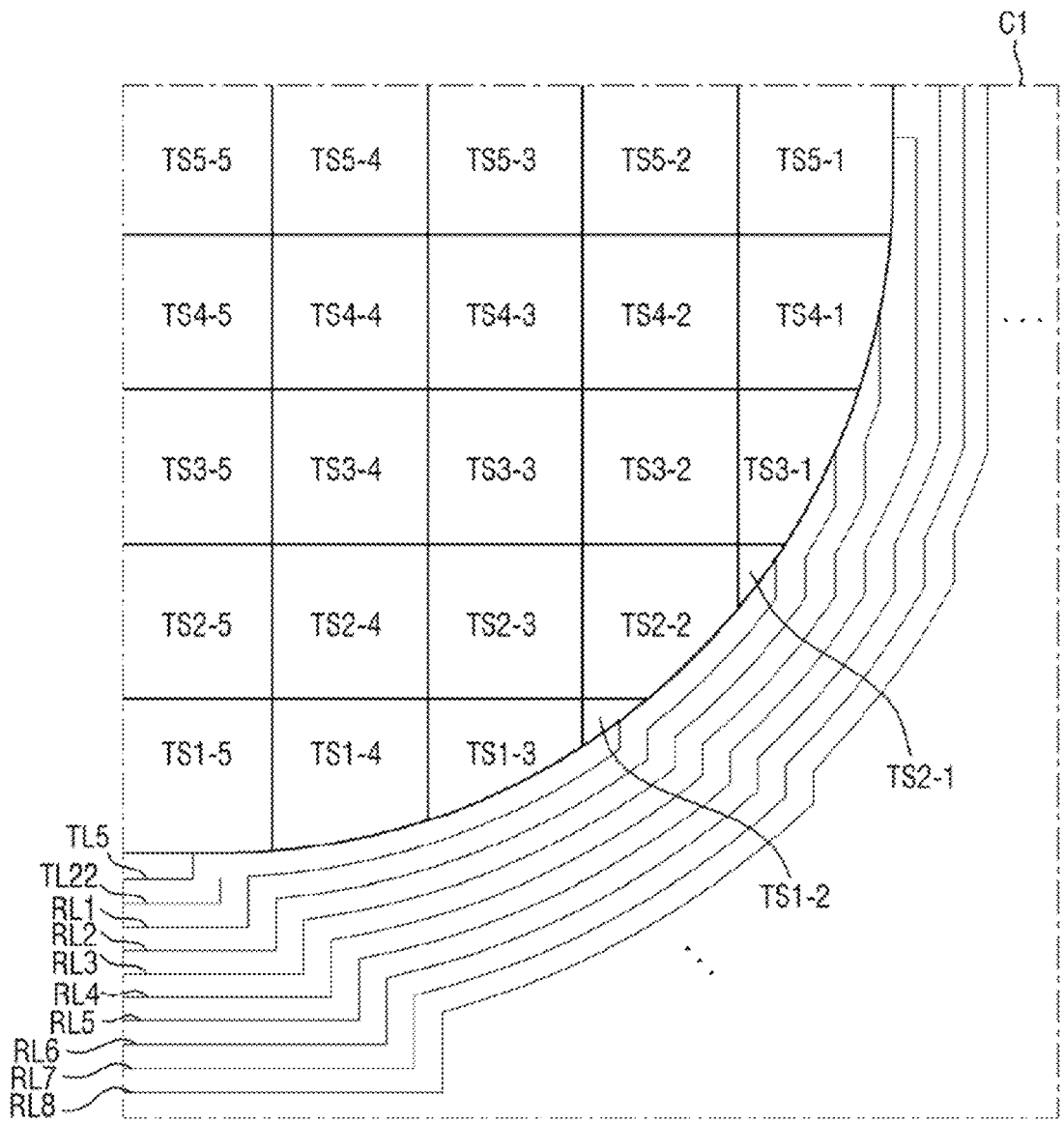
FIG. 17 is an enlarged plan view illustrating an embodiment of area C1 of FIG. 15.

In addition, as shown in FIG. 17, the first sensing line RL1 may be connected to a first-second touch sensor TS1-2, the second sensing line RL2 may be connected to a second-first touch sensor TS2-1, and the third sensing line RL3 may be connected to a third-first touch sensor TS3-1. The fourth sensing line RL4 may be connected to a fourth-first touch sensor TS4-1, and the fifth sensing line RL5 may be connected to a fifth-first touch sensor TS5-1.

Figure 18:
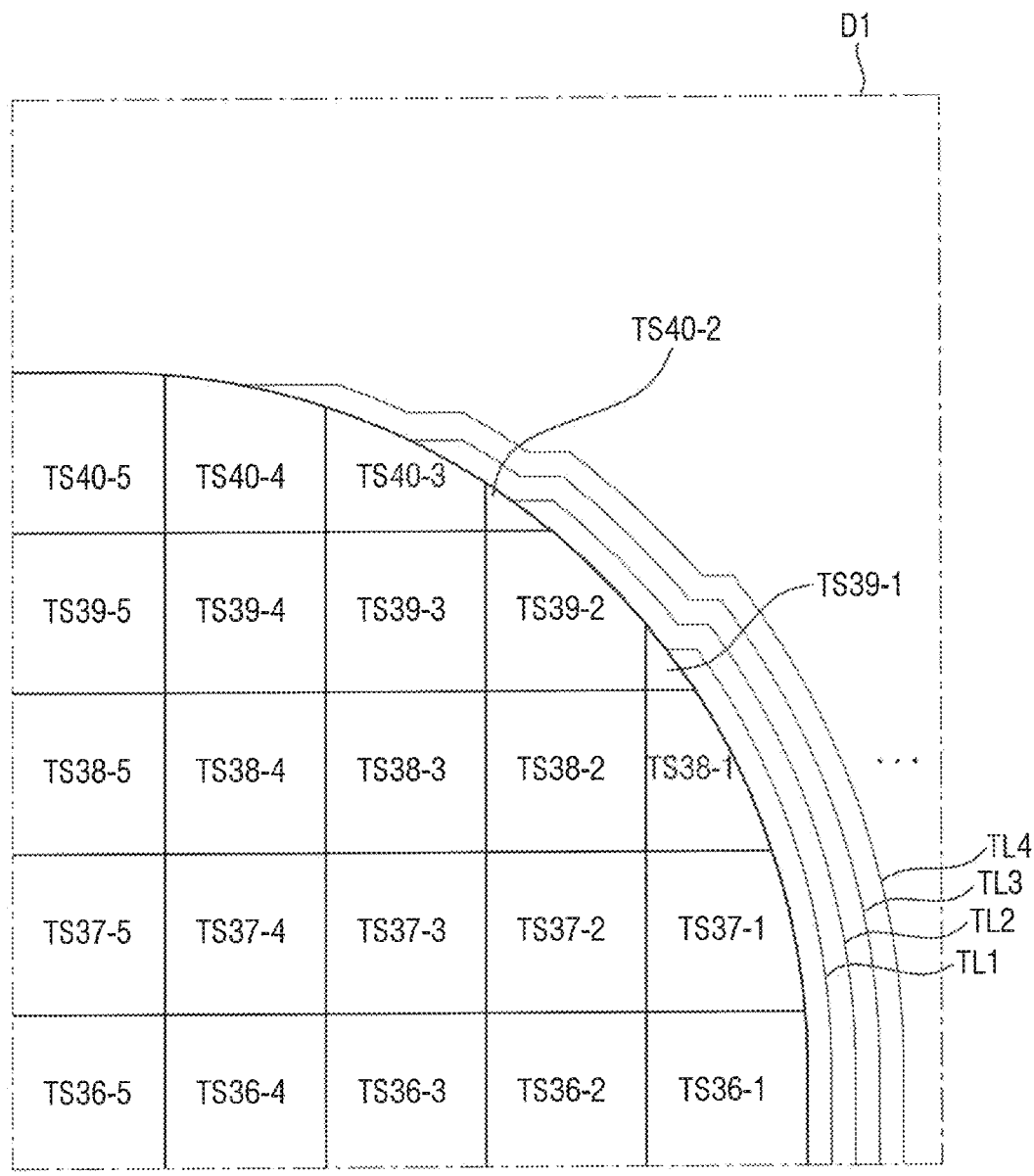
FIG. 18 is an enlarged plan view illustrating an embodiment of area D1 of FIG. 15.

In addition, as shown in FIG. 18,, the first driving line TL1 may be connected to a $39^{th}$-first touch sensor TS39-1, the second driving line TL2 may be connected to a $40^{th}$-second touch sensor TS40-2, and the third driving line TL3 be connected to a $40^{th}$-third touch sensor TS40-3. The fourth driving line TL4 may be connected to a $40^{th}$-fourth touch sensor TS40-4.

The first to fourth driving lines TL1 to TL4 may be disposed on the right side of the $27^{th}$ sensing line RL27. In this case, a sixth guard line GL6 may be disposed between the $27^{th}$ sensing line RL27 and the first driving line TL1.

A first guard line GL1 may be disposed on the right side of the $27^{th}$ sensing line RL27. A third guard line GL3 may be disposed between the fifth driving line TL5 and the first sensing line RL1 . A fourth guard line GL4 may be disposed on the left side of the $40^{th}$ sensing line RL40. A fifth guard line GL5 may be disposed between the $27^{th}$ sensing hue RL27 and the first guard line GL1 and between the 40 sensing line RL40 and the fourth guard line GL4.

In the exemplary embodiment shown in FIG. 15, the first to fourth driving lines TL1 to TL4 may be defined as driving lines of a first group or first touch lines of a first group, and the fifth to $25^{th}$ driving lines TL5 to TL25 may be defined as driving lines of a second group or first touch lines of a second group. In addition, the first to $27^{th}$ sensing lines RL1 to RL27 may be defined as sensing lines of a first group or second touch lines of a first group, and the $28^{th}$ to $40^{th}$ sensing lines RL28 to RL40 may be defined as sensing lines of a second group or second touch lines of a second group.

In this case, the sensing lines RL1 to RL27 of the first group may be disposed at the right side of the touch sensor area TSA, and the sensing lines RL28 to RL40 of the second group may be disposed at the left side of the touch sensor area TSA. The driving lines TL1 to TL4 of the first group may be disposed on the right side of the sensing lines RL1 to RL27 of the first group. The driving lines TL5 to TL25 of the second group may be disposed at a lower side of the touch sensor area TSA. The sensing lines RL1 to RL27 of the first group may be disposed between the driving lines TL1 to TL4 of the first group of and the driving lines TL5 to TL25 of the second group.

According to the exemplary embodiment shown in FIG. 15, the driving lines TL1 to TL25 and the sensing lines RL1 to RL40 are designed such that the driving lines and the sensing lines do not intersect each other in the round portions. For example, the first to fourth driving lines TL1 to TL4 are connected to the touch sensors TS in the second round portion RD2, the $22^{nd}$ to $25^{th}$ driving lines TL22 to 1125 are connected to the touch sensors TS in the third round portion RD3, and the first to fourth sensing lines RL1 to RL4 are connected to the touch sensors TS in the fourth round portion RD4. Accordingly, a short circuit between a driving line and a sensing line connected to touch sensors disposed in a round portion can be prevented so that the touch sensors can be disposed to detect a touch input in the round portion formed with a predetermined curvature.

In addition, according to the exemplary embodiment shown in FIG. 15, the first to $25^{th}$ driving lines TL1 to TL25 and the first to $40^{th}$ sensing lines RL1 to RL40 may include a plurality of touch signal layers so as to lower resistance.

Figure 19:
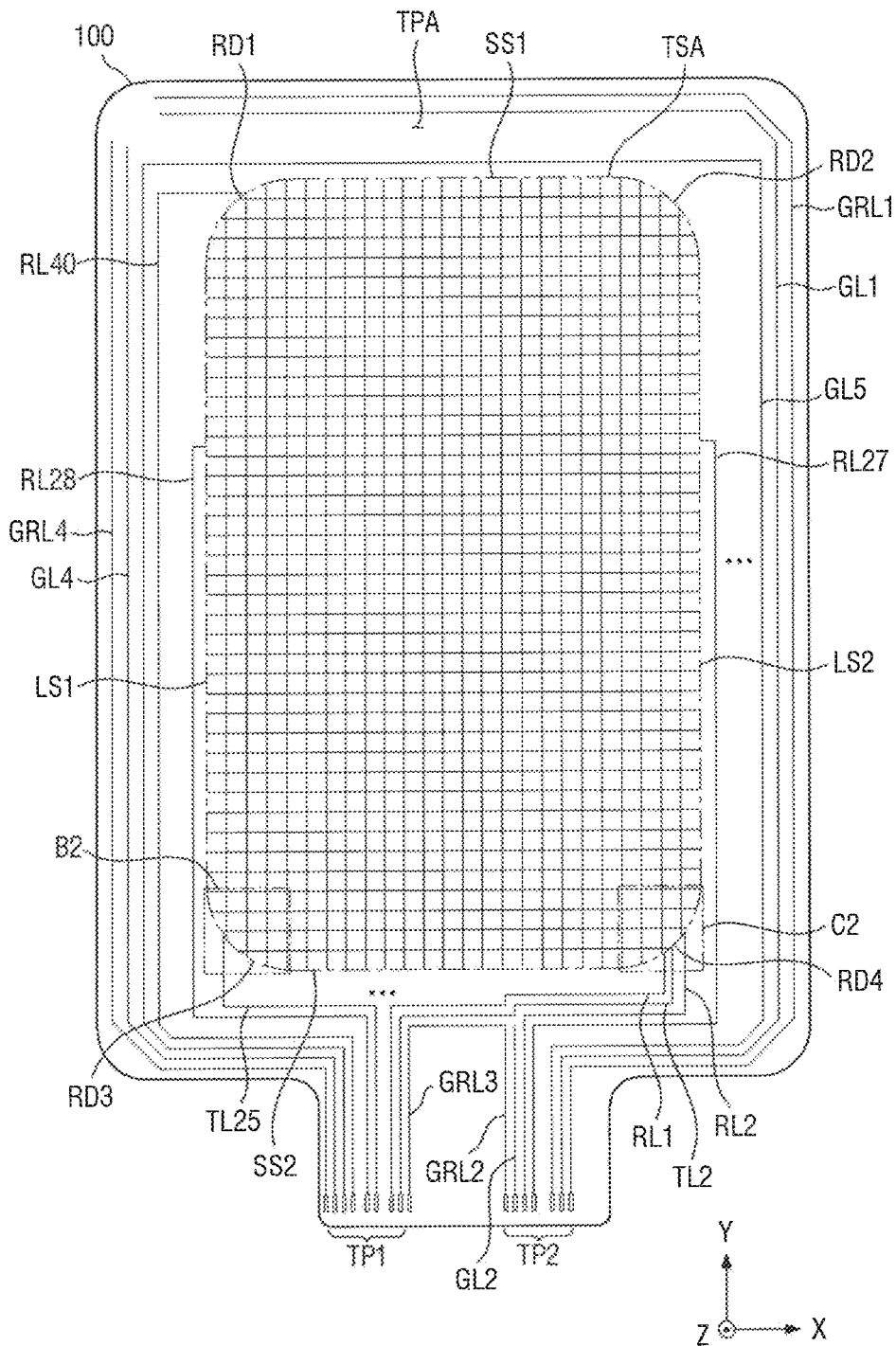
FIG. 19 is a plan view illustrating still another embodiment of a touch sensing unit of FIG. 3 in detail.

FIG. 19 is a plan view illustrating still another embodiment of the touch sensing unit of FIG. 3 in detail.

The exemplary embodiment shown in FIG. 19 is different from the exemplary embodiment shown in FIG. 5 in that driving lines and sensing, lines are alternately disposed in a fourth round portion RD4. Therefore, in the exemplary embodiment shown in FIG. 15, descriptions duplicated with those of the exemplary embodiment shown in FIG. 5 will be omitted.

Referring to FIG. 19, first to $27^{th}$ sensing lines RL1 to RL27 are disposed at a right side of a touch sensor area TSA, and $28^{th}$ to $40^{th}$ sensing lines RL28 to RL40 are disposed at a left side of the touch sensor area TSA. Since the first to $27^{th}$ sensing lines RL1 to RL27 are disposed at the right side of the touch sensor area TSA, the driving lines and the sensing lines do not intersect each other in a third round portion RD3. Instead, since the first to $27^{th}$ sensing lines RL1 to RL27 are disposed at the right side of the touch sensor area TSA, the first to fourth sensing lines RL1 to RL4 may be connected to touch sensors TS in a fourth round portion RD4. In this case, in order to prevent the driving lines from intersecting the sensing lines in the fourth round portion RD4, first to fourth driving lines TL1 to TL4 and the first to fourth sensing lines RL1 to RL4 may be connected to the touch sensors TS in the fourth round portion RD4.

Figure 20:
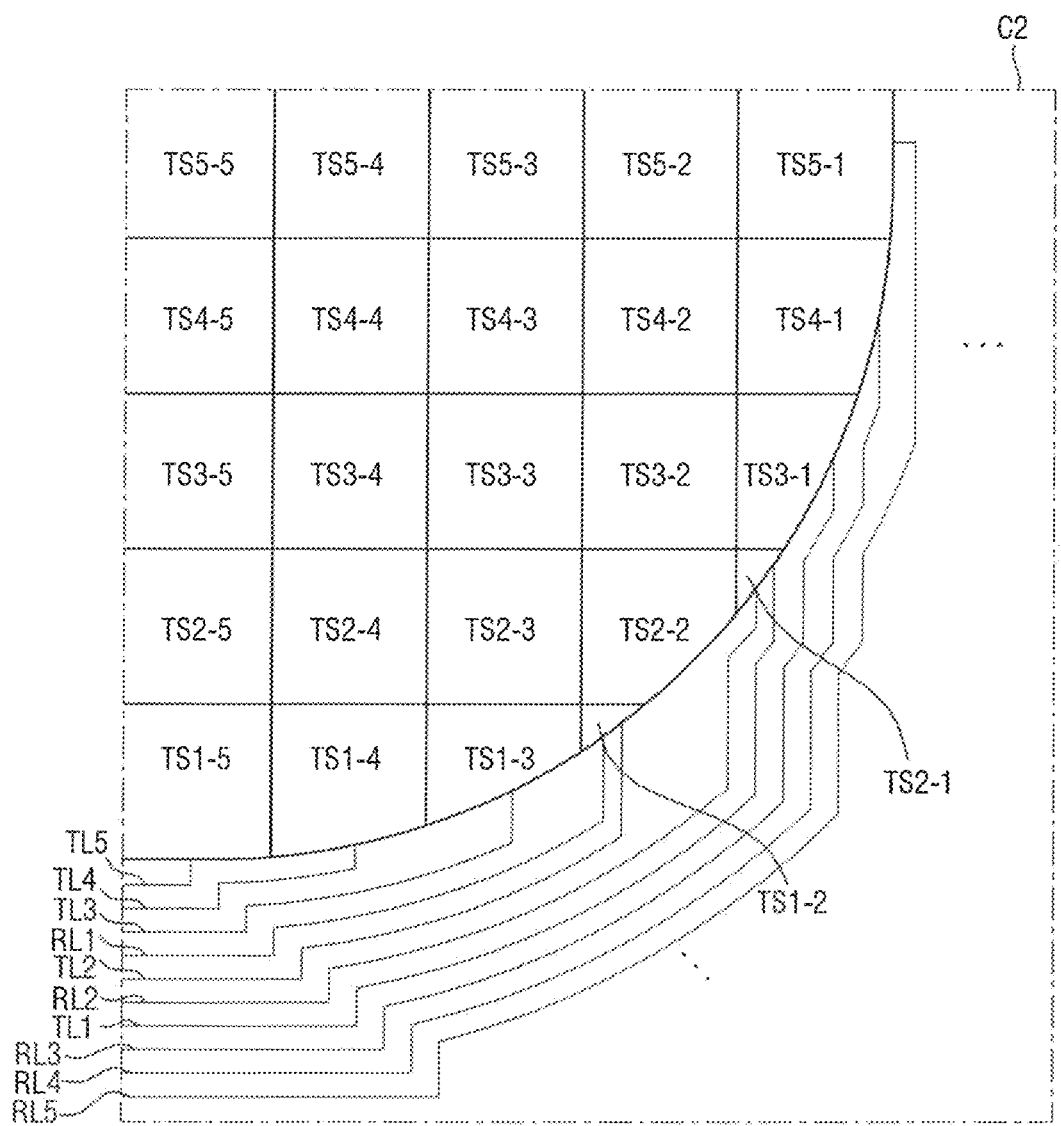
FIG. 20 is an enlarged plan view illustrating an embodiment of area C2 of FIG. 19.

For example, as shown in FIG. 20, the fourth driving line TL4, the third driving line TL3, the first sensing line RL1, the second driving line TL2, the second sensing line RL2, the first driving line TL1, the third sensing line RL3, and the fourth sensing line RL4 may be sequentially disposed. In this case, the fourth driving line TL4 may be connected to a first-fourth touch sensor TS1-4, and the third driving line TL3 may be connected to a first-third touch sensor TS1-3. In addition, the first sensing line RL1 and the second driving line TL2 may be connected to a first-second touch sensor TS1-2, and the second sensing and the first driving line TL1 may be connected to a second-first touch sensor TS2-1. Furthermore, the third sensing line RL3 may be connected to a third-first touch sensor TS3-1, and the fourth sensing line RL4 may be connected to a fourth-first touch sensor TS4-1.

Meanwhile, since an enlarged plan view of area B2 shown in FIG. 19 is substantially the same as that of FIG. 16, detailed descriptions thereof will be omitted.

A first guard line GL1 may be disposed on the right side of the $27^{th}$ sensing line RL27. A fourth guard line GL4 may be disposed on the left side of the $40^{th}$ sensing line RL40. A fifth guard line GL5 may be disposed between the $27^{th}$ sensing line RL27 and the first guard line GL1 and between the $40^{th}$ sensing line GL40 and the fourth guard line GL4. In addition, in order to minimize the sensing lines and the driving lines being influenced by each other, guard lines may be additionally disposed between the third driving line TL3 and the first sensing line RL1, between, the first sensing line RL1 and the second driving line TL2, between the second driving line TL2 and the second sensing line RL2, between the second sensing line RL2 and the first driving line TL1, and between the first driving line TL1 and the third sensing line RL3.

according to the exemplary embodiment shown in FIG. 19, driving lines TL1 to TL25 and the sensing lines RL1 to RL40 are designed such that the driving lines and the sensing lines do not intersect each other in round portions. For example, the driving, lines and the sensing lines connected to the touch sensors TS disposed in the fourth round portion RD4 are alternately disposed. Accordingly, a short circuit between a driving line and a sensing line connected to touch sensors disposed in a round portion can be prevented so that the touch sensors can be disposed to detect a touch input in the round portion formed with a predetermined curvature.

In addition, according to the exemplary embodiment shown in FIG. 19, first to $25^{th}$ driving lines TL1 to TL25 and the first to $40^{th}$ sensing lines RL1 to RL40 may include a plurality of touch signal layers so as to lower resistance.

Figure 21:
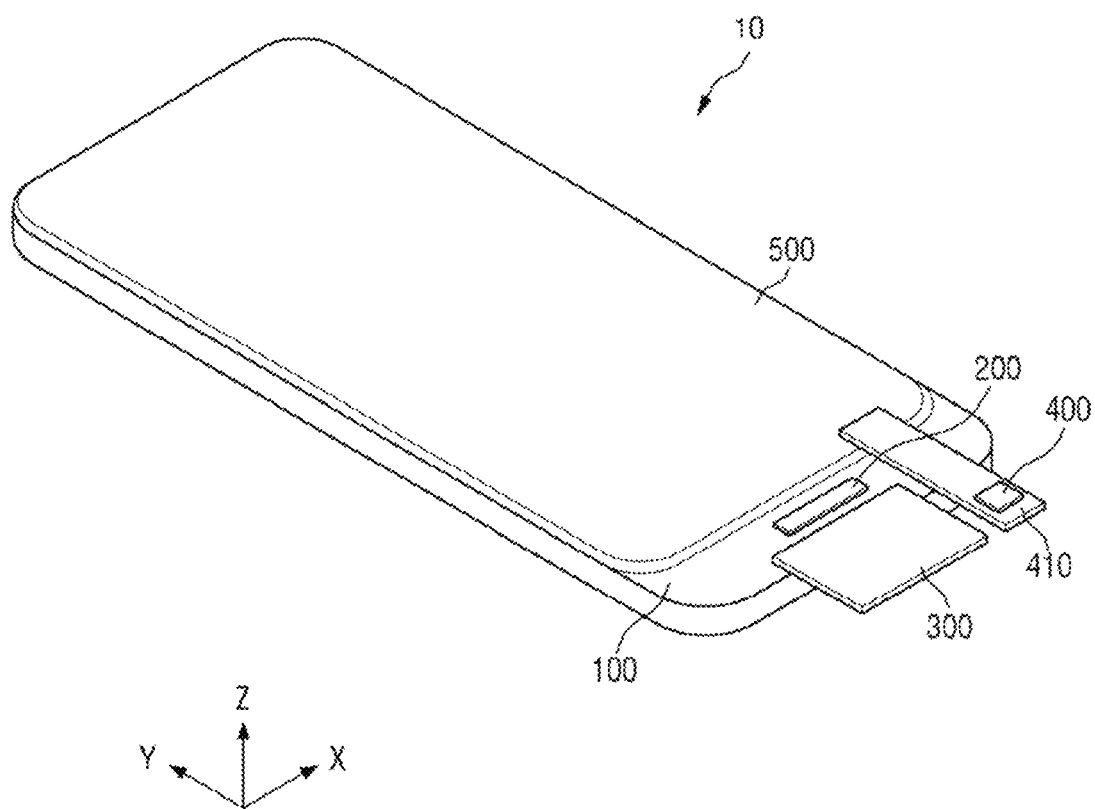
FIG. 21 is a perspective view illustrating a display device according to another exemplary embodiment.
Figure 22:
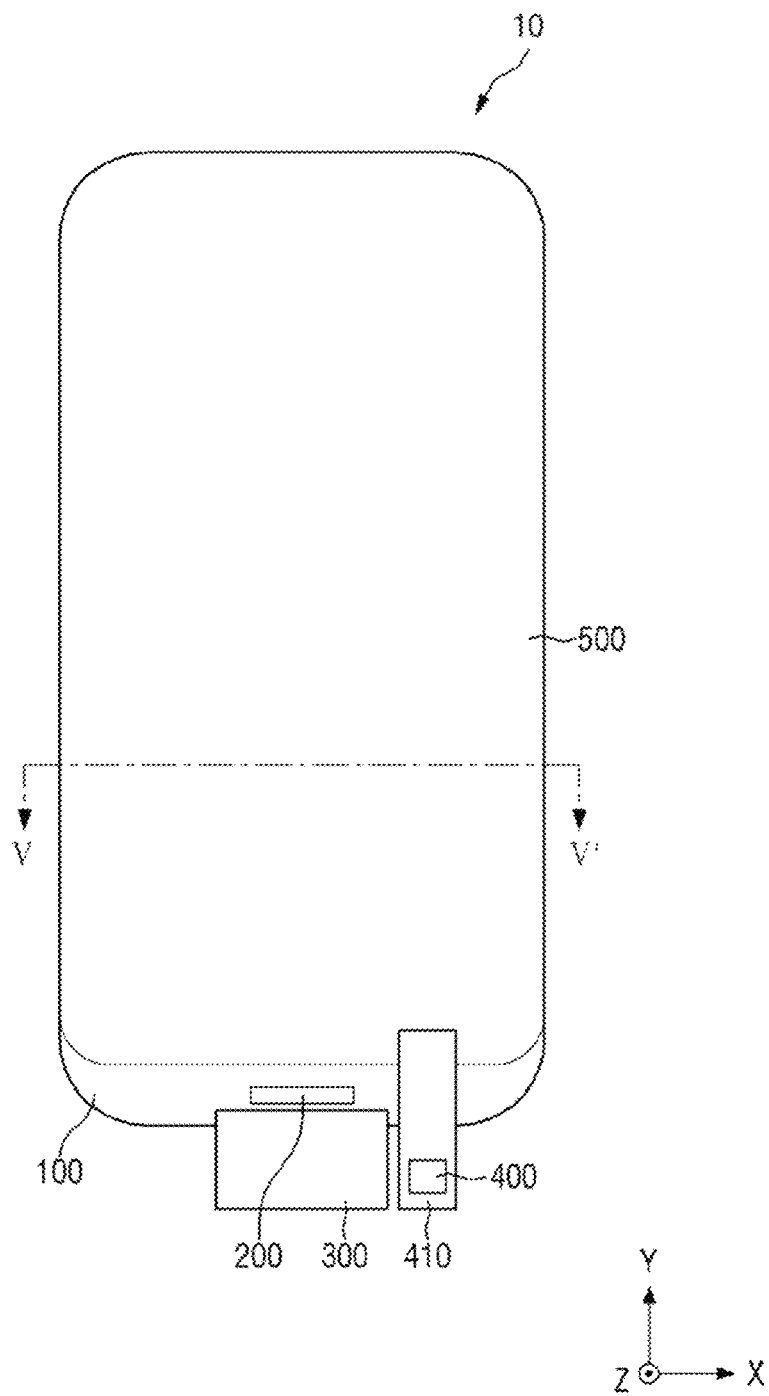
FIG. 22 is a plan view illustrating the display device according to another exemplary embodiment.

FIG. 21 is a perspective view illustrating a display device according to another exemplary embodiment. FIG. 22 is a plan view illustrating the display device according to another exemplary embodiment.

The exemplary embodiment shown in FIGS. 21 and 22 is different from the exemplary embodiment shown in FIGS. 1 and 2 in that a display panel 100 is formed to be flat and a touch circuit board 410 is disposed on a touch sensing unit 500. In FIGS. 21 and 22, descriptions duplicated with those of the exemplary embodiment shown in FIGS. 1 and 2 will be omitted, and differences from the exemplary embodiment shown in FIGS. 1 and 2 will be mainly described.

Referring to FIGS. 21 and 22, a display device 10 according to the exemplary embodiment includes the display panel 100, a display driving circuit 200. a circuit board 300, and a touch driving circuit 400.

The display panel 100 shown in FIGS. 1 and 2 may be a flexible display panel, and the display panel 100 shown in FIGS. 21 and 22 may be a rigid display panel.

Although a planar shape of the display device 10 is illustrated as being formed as a quadrangular shape having edges or corners that are rounded, the present disclosure is not limited thereto, and the planar shape of the display device 10 may be formed as another polygonal shape, circular shape, or elliptical shape. The display panel 100 may be formed to be substantially flat.

The display panel 100 may include pixels disposed in a display area to display an image and display pads disposed in a non-display area. The display pads may be formed on the display panel 100 at one edge of the display panel 100 and electrically connected to the circuit board 300.

The display driving circuit 200 may be attached onto a portion of the display panel 100 which is exposed without being covered by a touch sensing unit 500. Alternatively, the display driving circuit 200 may be mounted on the circuit board 300.

The touch sensing unit 500 may be disposed on the display panel 100. The touch sensing unit 500 may be formed in a rectangular planar shape which has short sides in a first direction (X-axis direction) and long sides in a second direction (V-axis direction). A corner at which the short side in the first direction (X-axis direction) meets the long side in the second direction (Y-axis direction) may be rounded to have a predetermined curvature formed at a right angle. A planar shape of the touch sensing unit 500 is not limited to a quadrangular shape but may be formed as another polygonal shape, circular shape, or elliptical shape. The planar shape of the touch sensing unit 500 may be similar to the planar shape of the display panel 100. The touch sensing unit 500 may be formed to be substantially flat.

The touch sensing unit 500 may include touch electrodes disposed in a touch sensor area to detect a touch of a user and touch pads disposed in a touch peripheral area. The touch pads may be formed on the touch sensing unit 500 at one edge of the touch sensing unit 500 and electrically connected to a touch circuit board 410.

The touch circuit hoard 410 may be attached onto the touch electrode pads of the touch sensing unit 500 using an anisotropic conductive film. Accordingly, lead lines of the touch circuit board 410 may be electrically connected to the touch electrode pads of the touch sensing unit 500. The touch circuit board 410 may be a flexible film such as a flexible printed circuit board, a printed circuit board, or a chip-on film. The touch driving circuit 400 may be formed as an IC and mounted on the circuit board 300.

Figure 23:
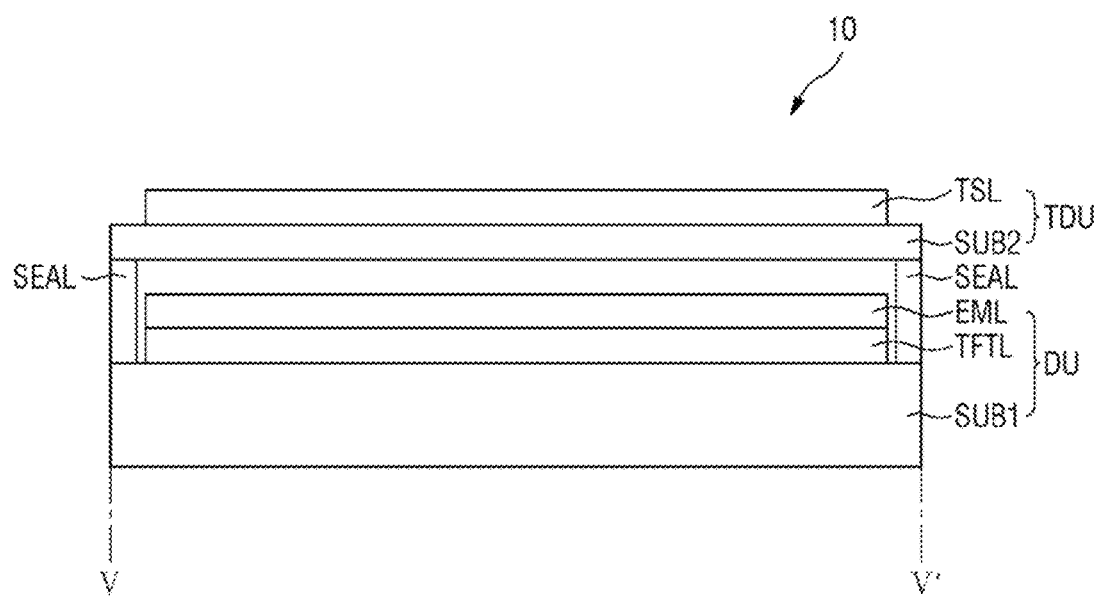
FIG. 23 is a cross-sectional view of an embodiment which is taken along line V-V' of FIG. 22.

FIG. 23 is a cross-sectional view of an embodiment which is taken along line V-V' of FIG. 22.

The exemplary embodiment shown in FIG. 23 is different from the exemplary embodiment shown in FIG. 3 in that a thin film encapsulation layer TEEL is omitted and a second substrate SUB2 is instead disposed on a light-emitting element layer EML. In FIG. 23, descriptions duplicated with those of the exemplary embodiment shown in FIG. 3 will be omitted.

Referring to FIG. 23, the display device 10 may include a display unit DU, a touch sensing unit TDU, and an adhesive member SEAL for bonding the display unit DU and the touch sensing unit TDU.

The display unit DU may include a first substrate SUB1, a thin film transistor layer TFTL, and the light-emitting element layer EML. Except that the first substrate SUB1 is formed as a rigid substrate including a glass substrate or a plastic film and the display it DU does not chide the thin film encapsulation layer TFEL, the display unit DU is substantially the same as that described with reference to FIG. 3, and thus detailed descriptions of the display unit DU will be omitted in FIG. 23.

The touch sensing unit TDU may include the second substrate SUB2 and a touch sensor layer TSL.

The second substrate SUB2 may be a rigid substrate including a glass substrate or a plastic film. The second substrate SUB2 may serve as an encapsulation substrate that encapsulates the light-emitting element layer EML.

The touch sensor layer TSL may be disposed on the second substrate SUB2. Since the touch sensor layer TSL is substantially the same as that described with reference to FIG. 3, detailed descriptions of the touch sensor layer TSL will be omitted in FIG. 23.

The adhesive member SEAL may bond the first substrate SUB1 of the display unit DU and the second substrate SUB2 of the touch sensing unit TDU. The adhesive member SEA may include a frit adhesive layer, an ultraviolet curable resin, or a thermosetting resin, but the present disclosure is not limited thereto.

FIG. 3 illustrates that an empty space is formed between the light-emitting element layer EML and the second substrate SUB2. However, exemplary embodiments of the present disclosure are not limited thereto. For example, a filling film may be disposed between the light-emitting clement layer EML and the second substrate SUB2. The filling film may be an epoxy filling film or a silicon filling film.

Figure 24:
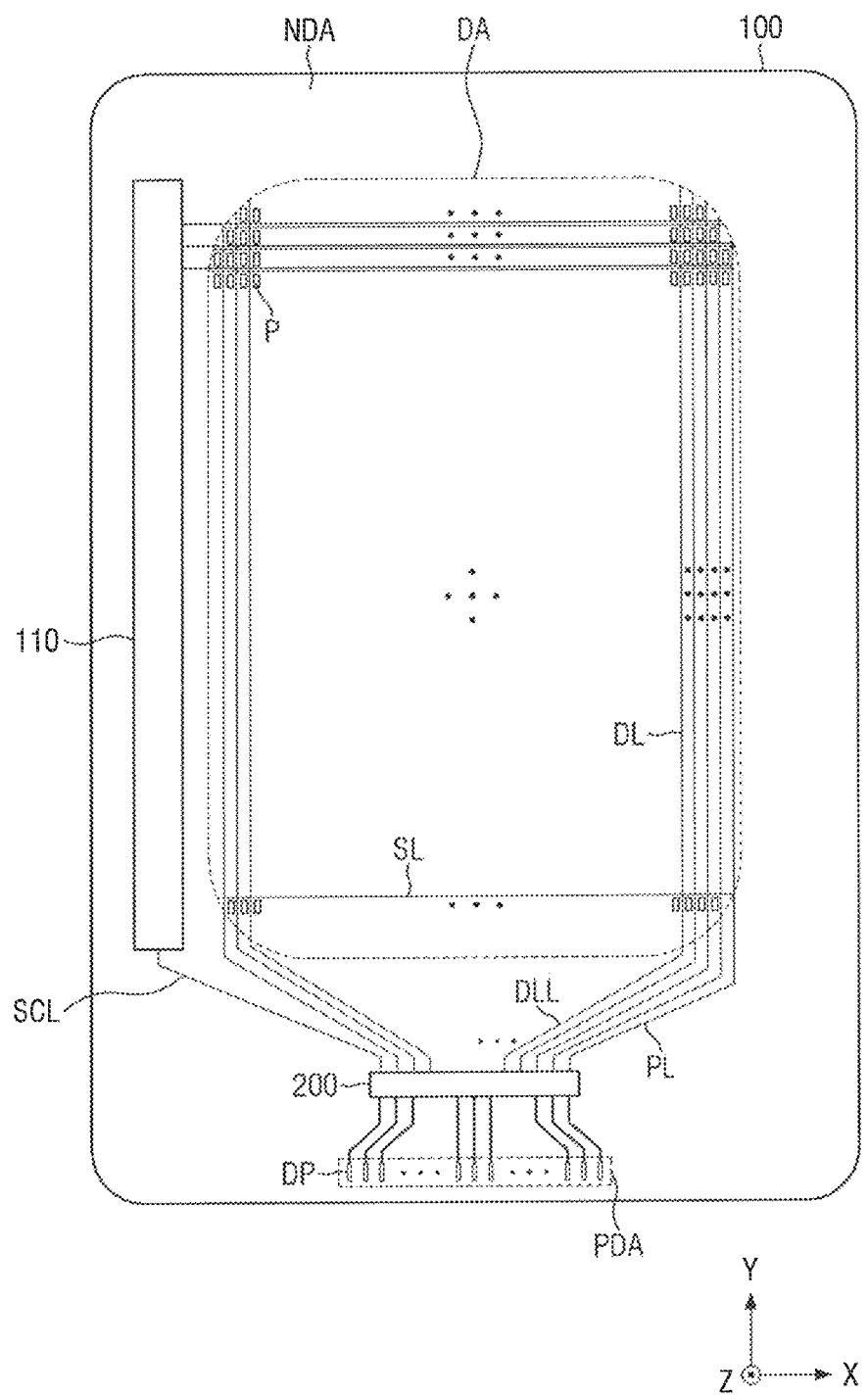
FIG. 24 is a plan view illustrating an embodiment of a display unit FIG. 23 in detail.
Figure 25:
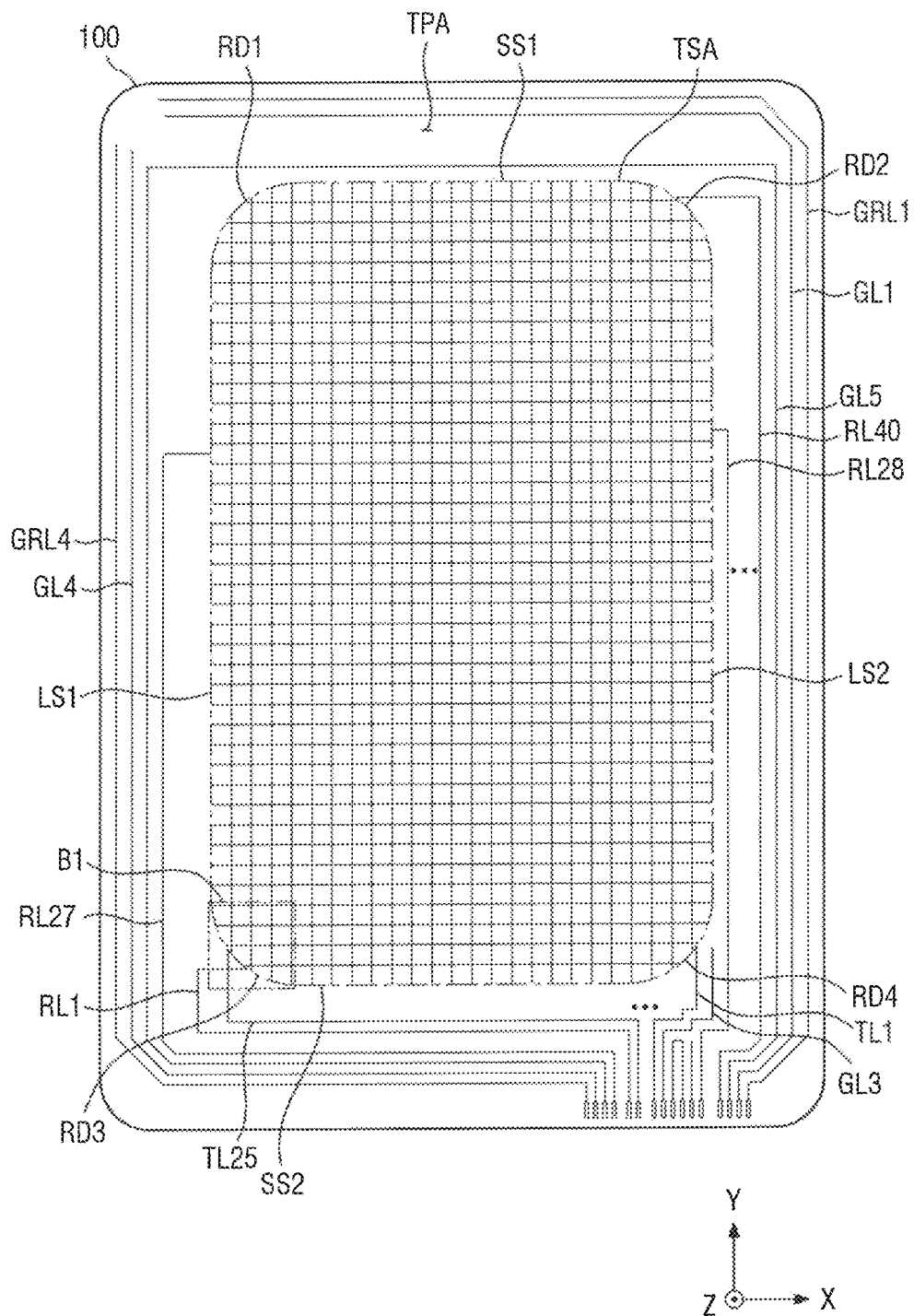
FIG. 25 is a plan view illustrating an embodiment of the touch sensing unit of FIG. 23 in detail.

FIG. 24 is a plan view illustrating an embodiment of the display unit of FIG. 23 in detail. FIG. 25 is a plan view illustrating an embodiment of the touch sensing unit of FIG. 23 in detail.

The exemplary embodiment shown in FIGS. 24 and 25 is different from the exemplary embodiment shown in FIGS. 4 and 5 in that display pads DP are formed on the first substrate SUB1 of the display panel 100 and touch pads TP are formed on the second substrate SUB2.

FIG. 2 is an enlarged plan view illustrating an embodiment of touch sensors of FIG. 22.

Figure 26:
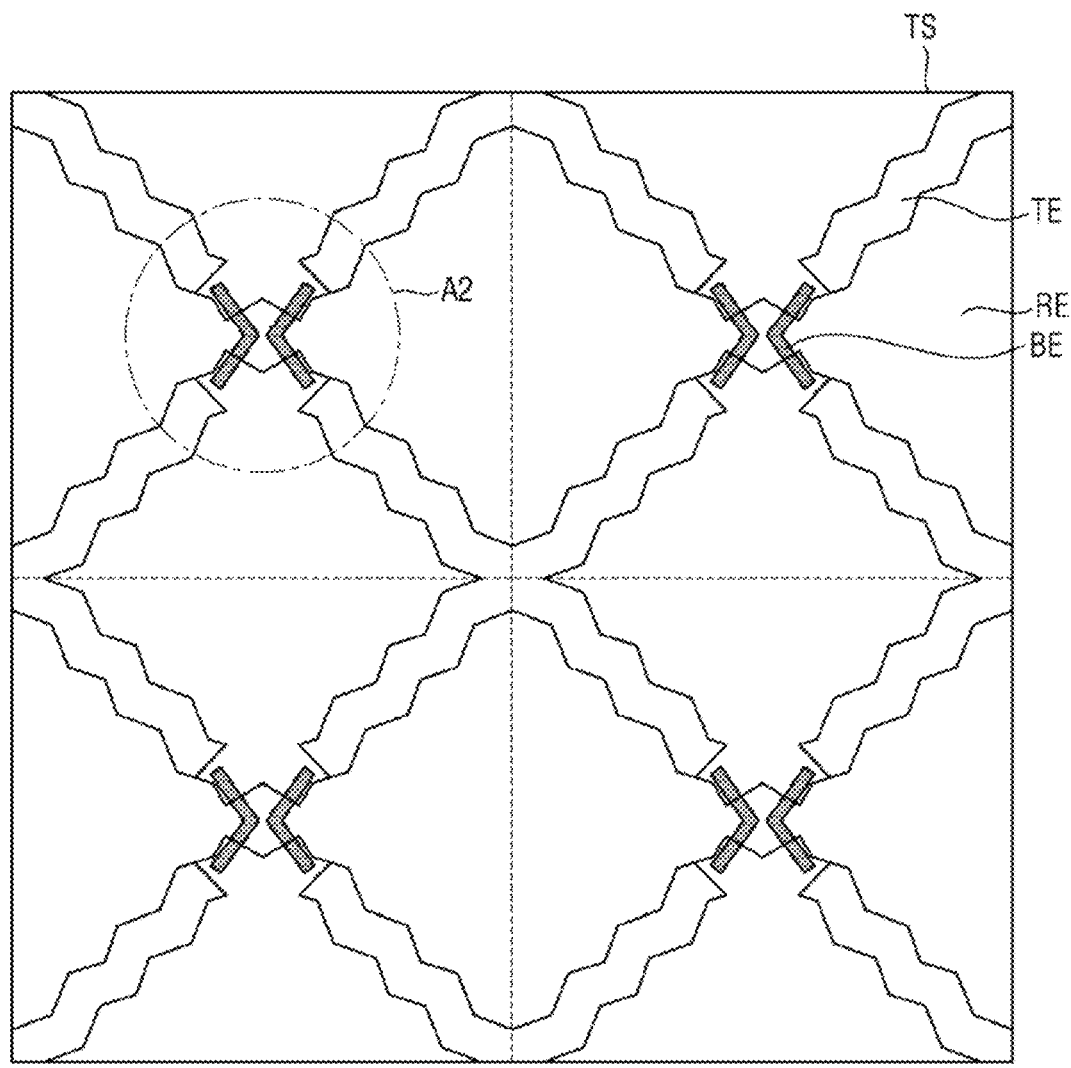
FIG. 26 is an enlarged plan view illustrating an embodiment of touch sensors of FIG. 22.

Referring to FIG. 26, first touch electrodes TE and second touch electrodes RE are illustrated as being formed in a diamond shape in a plan view. However, the present disclosure is not limited thereto. In order to prevent a moire phenomenon from being caused by the first touch electrodes TE and the second touch electrodes RE when an image of the display device 10 is viewed, the first touch electrodes TE and the second touch electrodes RE may have uneven sides in a plan view.

Figure 27:
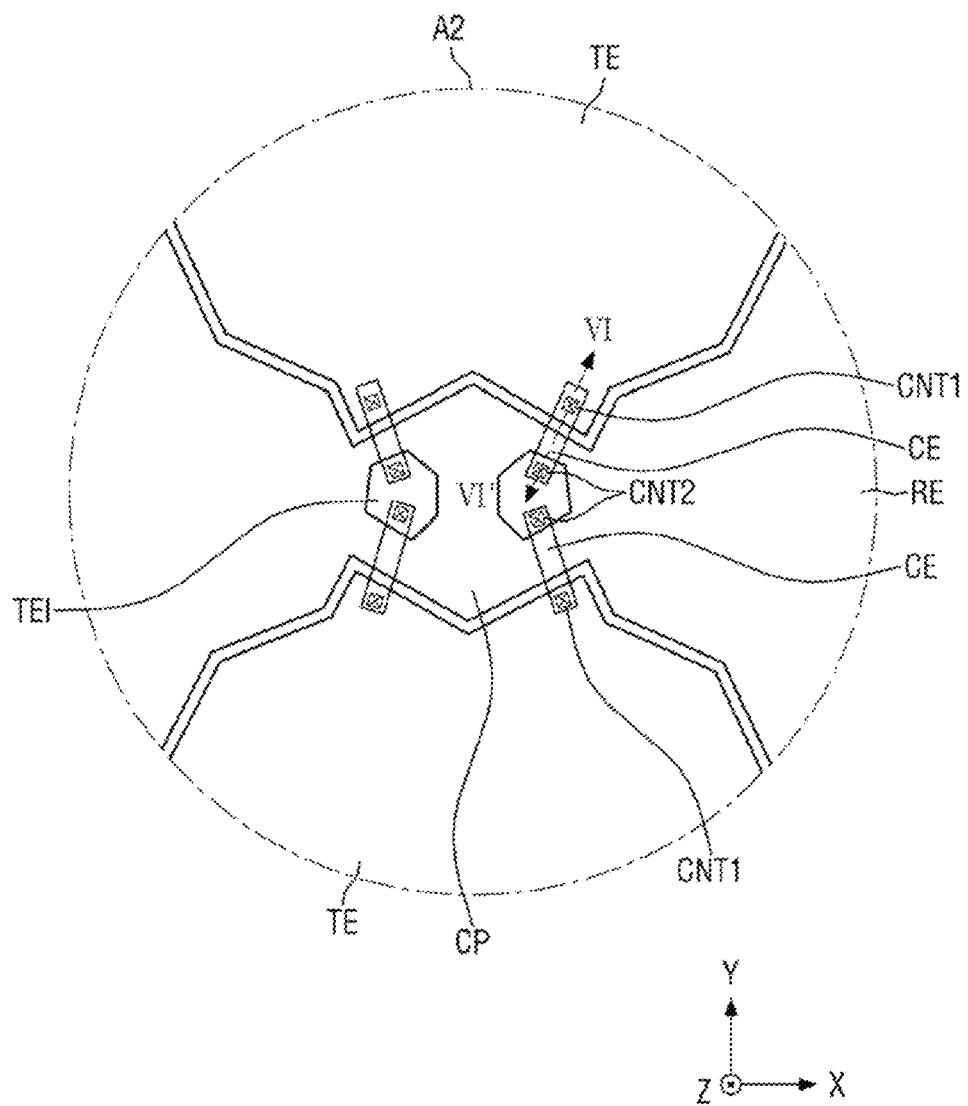
FIG. 27 is an enlarged plan view illustrating an embodiment of area A2 of FIG. 26.
Figure 28:
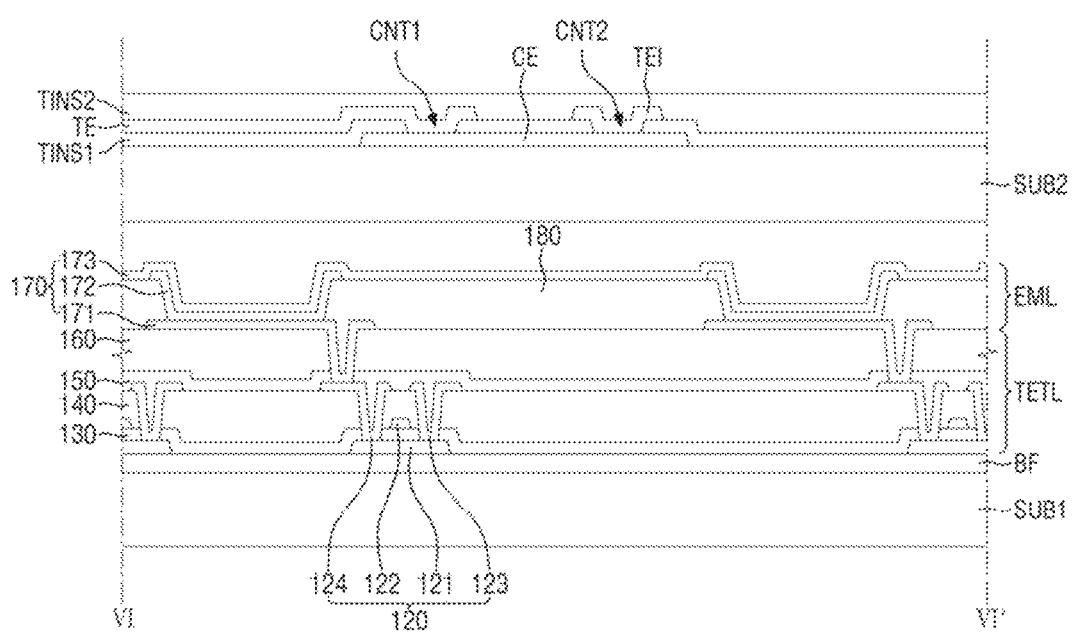

FIG. 27 is an enlarged plan view illustrating an embodiment of area A2 of FIG. 26. FIG. 28 is a cross-sectional view of an embodiment which is taken along line VI-VI' of FIG. 27.

in the exemplary embodiment shown in FIGS. 27 and 28, the second substrate SUB2 is disposed on the light-emitting element layer EML, and the first touch electrodes the second touch electrodes RE, connection electrodes BE, touch island electrodes TEI, driving lines TL1 to TL25, sensing lines RL1 to RL40, guard lines GL1, GL2, GL3, GL4, and GL5, and ground lines GRL1, GRL2, GRL3, and GRL4 are farmed on the second substrate SUB2. In FIGS. 27 and 28, for convenience of description, only the first touch electrodes TE, the second touch electrodes RE, the first touch island electrodes TEI disposed between the first touch electrodes TE, and the connection electrodes CE are illustrated as being formed on the second substrate SUB1.

The connection electrodes CE are formed on the second substrate SUB2. Each of the connection electrodes CE connects the first touch electrode TE and the first touch island electrode TEI. One end portion of each of the connection electrodes CE may be connected to the first touch electrode TE, and the other end portion thereof may be connected to the first touch island electrode TEL The connection electrodes CE may be formed as opaque metal conductive layers. For example, the connection electrodes CE may be formed to include a stacked structure (Ti/Al/Ti) including aluminum and titanium, a stacked structure (ITO/Al/ITO) including aluminum and ITO, an APC alloy, or a stacked. structure (ITO/APC/ITO) including, an APC alloy and ITO, but the present disclosure is not limited thereto. Accordingly, in order to prevent aperture ratios of subpixels R, G, and B from being decreased, the connection electrodes CE may be disposed to not overlap the subpixels R, G, and B and to overlap a pixel definition film 180.

A first touch insulating film TINS1 is formed on the connection electrodes CE. The first touch insulating film TNIS1 may be formed as an inorganic film, for example, a silicon nitride layer, a silicon oxynitride layer, a silicon oxide layer, a titanium oxide layer, or an aluminum oxide layer.

The first touch electrode TE, the lint touch island electrodes TEI, and the second touch electrodes RE may be formed on the first touch insulating film. TINS1. The first touch electrode TE may be connected to the connection electrode CE through a first contact hole CNT1 passing through the first touch insulating film TINS1 to expose the connection electrode CE. The first touch island electrode may be connected to the connection electrode CE through a second contact hole CNT2 passing through the first touch insulating film TINS1 to expose the connection electrode CE. Accordingly, the first touch electrode TE and the first touch island electrode TEI may be connected through the connection electrode CE. Accordingly, the first touch electrodes TE disposed in the second direction (Y-axis direction) in each of a plurality of columns may be electrically connected.

The first touch electrode TE, the first touch island electrodes TEL and the second touch electrodes RE may be made of a TCO capable of transmitting fight, such as ITO or IZO. Accordingly, even when the first touch electrodes TE, the first touch island electrodes TEL and the second touch electrodes RE overlap pixels P, aperture ratios of the pixel P are not decreased.

A second touch insulating film TINS2 is formed on the first touch electrodes TE, the first touch island electrodes TEL and the second touch electrodes RE. The second touch insulating film TINS2 may be formed as an organic film made of acryl resin, epoxy resin, phenolic resin, polyamide resin, PI resin, or the like.

Meanwhile, as described with reference to FIGS. 10 and 11, in the exemplary embodiment shown in FIGS. 21 to 28, the driving lines TL1 to TL25 and the sensing lines RL1 to RL40 may include first touch signal layers TSL1 and second touch signal layers TSL2. In this case, the first touch signal layer TSL1 may be made of the same material as the connection electrodes CE to be coplanar with each other, and the second touch signal layer TSL2 may be made of the same material as the first touch electrodes TE, the first touch islands electrodes TS1 and the second touch electrodes RE to be coplanar with each other. That is, the first touch signal layer TSL1 may be disposed on the second substrate SUB2 and may be made of an opaque metal material and, for example, may include a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO. On the contrary, the second touch signal layer TSL2 may be made of a TCO capable of to light, such as ITO or IZO.

Alternatively, the first touch electrodes TE, the first touch island electrodes TEI, and the second touch electrodes RE may be formed on the second substrate SUB2, and the connection electrodes CE may be formed on the first touch insulating film TINS1. In this case, the first touch signal layer TSL1 may be made of the same material as the first touch electrodes to be coplanar with each other, the first touch island electrodes TEL and the second touch electrodes RE, and the second touch signal layer TSL2 may be made of the same material as the connection electrodes CE to be coplanar with each other. That is, the first touch signal layer TSL1 may be made of a TCO capable of transmitting light, such as ITO or IZO, and the second touch signal layer TSL2 may be made of an opaque metal material and, for example, may include a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO.

In addition, in the exemplary embodiment shown in FIG. 15 and the exemplary embodiment shown in FIG. 19, the driving lines TL1 to TL25 and the sensing lines RL1 to RL40 may also include first opaque touch signal layers TSL1 and second transparent touch signal layers TSL2.

Although the exemplary embodiments of the present disclosure have been described with reference to the accompanying drawings, it will be understood. those skilled in the art to which the present disclosure pertains that the present disclosure can be carried out in other detailed forms without charming the technical spirits and essential features thereof. Therefore, it should be understood that the exemplary embodiments described herein are illustrative and not restrictive in all aspects.

The invention claimed is:

1. A touch sensing unit comprising:
    first touch electrodes and second touch electrodes disposed in a touch sensor area which includes a round portion having a curvature, the first touch electrodes extend in a first direction and the second touch electrodes extend in a second direction crossing the first direction, wherein a plurality of the first touch electrodes and a plurality of the second touch electrodes are disposed in the round portion;
    a driving line connected to a first touch electrode among the plurality of the first touch electrodes disposed in the round portion of the touch sensor area; and
    a sensing line connected to a second touch electrode among the plurality of the second touch electrodes disposed in the round portion of the touch sensor area,
    wherein the driving line and the sensing line intersect each other at an intersection area,
    wherein each of the driving line and the sensing line includes a first touch signal layer and a second touch signal layer, and
    wherein at the intersection area, the driving line includes the first touch signal layer among the first touch signal layer and the second touch signal layer, and the sensing line includes the second touch signal layer among the first touch signal layer and the second touch signal layer at the intersection area.

2. The touch sensing unit of claim 1, wherein a planar shape of the first touch electrode connected to the driving line in the round portion is different from a planar shape of first touch electrodes that are disposed in areas excluding the round portion.

3. The touch sensing unit of claim 2, wherein a planar shape of the second touch electrode connected to the sensing line in the round portion is different from a planar shape of second touch electrodes that are disposed in areas excluding the round portion.

4. The touch sensing unit of claim 1, wherein:
the first touch signal layer of the driving line intersects the second touch signal layer of the sensing line.

5. The touch sensing unit of claim 4, wherein the second touch signal layer is disposed on the first touch signal layer.

6. The touch sensing unit of claim 5, wherein the first touch electrodes and the second touch electrodes are disposed on a same layer with the second touch signal layer.

7. The touch sensing unit of claim 6, further comprising:
a connection electrode that connects the first touch electrodes and intersects the second touch electrodes,
wherein the connection electrode is disposed on a same layer with the first touch signal layer.

8. A touch sensing unit comprising:
first touch electrodes and second touch electrodes disposed in a touch sensor area, the first touch electrodes extend in a first direction and the second touch electrodes extend in a second direction crossing the first direction;
driving lines connected to the first touch electrodes;
sensing lines of a first group electrically connected to a first portion of the second touch electrodes; and
sensing lines of a second group electrically connected to a remaining portion of the second touch electrodes not including the first portion,
wherein at least one of the sensing lines of the first group intersects at least one of the driving lines at an intersection area,
wherein each of the driving lines and the sensing lines of the first group and the second group includes a first touch signal layer and a second touch signal layer, and
wherein at the intersection area, the at least one driving line includes the first touch signal layer among the first signal layer and the second touch signal layer, and the at least one sensing lines of the first group includes the second touch signal layer among the first signal layer and the second touch signal layer.

9. The touch sensing unit of claim 8, wherein:
the touch sensor area includes a round portion having a curvature, wherein a plurality of the first touch electrodes and a plurality of the second touch electrodes are disposed in the round portion;
at least one of the sensing lines of the first group is connected to a second touch electrode of the plurality of second touch electrodes that is disposed in the round portion; and
at least one of the driving lines is connected to a first touch electrode of the plurality of first touch electrodes that is disposed in the round portion.

10. The touch sensing unit of claim 8, wherein:
the sensing lines of the first group are disposed at a first side of the touch sensor area; and
the sensing lines of the second group are disposed at a second side of the touch sensor area.

11. The touch sensing unit of claim 8, wherein a number of the sensing lines of the first group is less than a number of the sensing lines of the second group.

12. The touch sensing unit of claim 8, further comprising:
first touch pads connected to the sensing lines of the first group; and
second touch pads connected to the sensing lines of the second group.

13. The touch sensing unit of claim 12, wherein:
the first touch pads are disposed at a first side of a pad area; and
the second touch pads are disposed at a second side of the pad area.

14. The touch sensing unit of claim 8, further comprising a guard line surrounding a sensing line disposed at an outermost side among the sensing lines of the first group and a sensing line disposed at an outermost side among the sensing lines of the second group.

15. A touch sensing unit comprising:
first touch electrodes and second touch electrodes disposed in a touch sensor area that includes a plurality of round portions, wherein a plurality of the first touch electrodes and a plurality of the second touch electrodes are disposed in the round portion;
driving lines of a first group electrically connected to a first portion of the first touch electrodes;
driving lines of a second group electrically connected to a remaining portion of the first touch electrodes not including the first portion of the first touch electrodes and not electrically connected to the first portion of the first touch electrodes;
sensing lines of a first group electrically connected to a first portion of the second touch electrodes; and
sensing lines of a second group electrically connected to a remaining portion of the second touch electrodes not including the first portion of the second touch electrodes and not electrically connected to the first portion of the second touch electrodes,
wherein some of the sensing lines of the first group are connected to the second touch electrodes disposed in a first round portion of the plurality of round portions, and
the driving lines of the first group are connected to the first touch electrodes disposed in a second round portion of the plurality of round portions,
wherein each of the driving lines of the first and second groups and the sensing lines of the first and second groups includes a first touch signal layer and a second touch signal layer, and
wherein the first touch electrodes and the second touch electrodes are disposed on a same layer with the second touch signal layer, and
wherein:
the sensing lines of the first group and the s of the first group are disposed at a first side of the touch sensor area,
the sensing lines of the second group are disposed at a second side of the touch sensor area,
the driving lines of the second group are disposed at a third side of the touch sensor area, and
a length of each of the driving lines of the first group is longer than a length of the sensing lines of the first group.

16. The touch sensing unit of claim 15, wherein the sensing lines of the first group are disposed between the driving lines of the first group and the driving lines of the second group.

17. The touch sensing unit of claim 15, further comprising a guard line disposed between the sensing lines of the first group and the driving lines of the first group.

18. The touch sensing unit of claim 15, wherein a number of the sensing lines of the first group is less than a number of the sensing lines of the second group.

19. The touch sensing unit of claim 15, wherein a number of the driving lines of the first group is less than a number of the driving lines of the second group.

20. A display device comprising:
- a display unit including a display area which includes pixels; and
- a touch sensor area overlapping the display area which includes a touch sensing unit,
- wherein the touch sensing unit includes:
  - first touch electrodes and second touch electrodes disposed in a round portion of the touch sensor area having a curvature, the first touch electrodes extend in a first direction and the second touch electrodes extend in a second direction crossing the first direction, wherein a plurality of the first touch electrodes and a plurality of the second touch electrodes are disposed in the round portion;
  - driving lines connected to a first portion of the plurality of first touch electrodes disposed in the round portion of the touch sensor area among the first touch electrodes; and
  - sensing lines connected to a first portion of the plurality of second touch electrodes disposed in the round portion of the touch sensor area among the second touch electrodes; and
- at least one driving line of the driving lines and at least one sensing line of the sensing lines intersect each other at an intersection area,
- wherein each of the driving lines and the sensing lines includes a first touch signal layer and a second touch signal layer, and
- wherein at the intersection area, the at least one driving line includes the first touch signal layer among the first signal layer and the second touch signal layer, and the at least one sensing lines of the first group includes the second touch signal layer among the first signal layer and the second touch signal layer.

* * * * *